US012728805B2

(12) United States Patent
Ushiro

(10) Patent No.: US 12,728,805 B2
(45) Date of Patent: Sep. 8, 2026

(54) PROCESSING APPARATUS, PROCESSING SYSTEM, AND PROCESSING METHOD

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shota Ushiro, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 611 days.

(21) Appl. No.: 18/247,513

(22) PCT Filed: Jul. 27, 2021

(86) PCT No.: PCT/JP2021/027701
§ 371 (c)(1),
(2) Date: Mar. 31, 2023

(87) PCT Pub. No.: WO2022/074902
PCT Pub. Date: Apr. 14, 2022

(65) Prior Publication Data
US 2023/0373415 A1 Nov. 23, 2023

(30) Foreign Application Priority Data
Oct. 6, 2020 (JP) ................................ 2020-169222

(51) Int. Cl.
*B60R 16/033* (2006.01)
*B60K 28/14* (2006.01)
(Continued)

(52) U.S. Cl.
CPC ............ *B60R 16/033* (2013.01); *B60K 28/14* (2013.01); *G01R 31/392* (2019.01); *H02J 7/60* (2026.01); *H02J 7/84* (2026.01); *H02J 7/855* (2026.01)

(58) Field of Classification Search
CPC ......... B60K 28/14; B60R 16/02; B60R 16/03; B60R 16/033; B60R 16/04; G01R 31/392;
(Continued)

(56) References Cited

U.S. PATENT DOCUMENTS

2008/0151454 A1 6/2008 Uhl
2012/0262106 A1 10/2012 Omiya et al.
(Continued)

FOREIGN PATENT DOCUMENTS

CN 200968986 * 10/2007
JP H7-191701 A 7/1995
(Continued)

OTHER PUBLICATIONS

International Search Report, Application No. PCT/JP2021/027701, mailed Sep. 14, 2021. ISA/Japan Patent Office.

*Primary Examiner* — Phutthiwat Wongwian
(74) *Attorney, Agent, or Firm* — Brooks Kushman P.C.

(57) ABSTRACT

Individual ECUs are mounted on a vehicle and execute processing using power supplied from one of a main power storage device and a sub power storage device. When a predetermined condition is satisfied, the processing unit of each individual ECU determines whether the supplying of power from the main power storage device has been interrupted. When it is determined that the supplying of power from the main power storage device has been interrupted, the processing unit of each individual ECU executes a
(Continued)

process that corresponds to a degree of deterioration of the sub power storage device out of a plurality of processes.

14 Claims, 13 Drawing Sheets

(51) Int. Cl.
*G01R 31/392* (2019.01)
*H02J 7/00* (2026.01)
*H02J 7/60* (2026.01)
*H02J 7/84* (2026.01)

(58) Field of Classification Search
CPC .......... H01M 10/48; H02J 7/00; H02J 7/0029; H02J 7/005; H02J 7/0063; Y02E 60/10
USPC .......................................................... 701/45
See application file for complete search history.

(56) References Cited

U.S. PATENT DOCUMENTS

2015/0001926 A1* 1/2015 Kageyama .............. E05B 81/86 307/10.1
2015/0108951 A1* 4/2015 Yamaguchi ........... H02J 7/0048 320/136
2016/0090052 A1* 3/2016 Nishijima ............... B60L 58/20 307/9.1
2019/0184921 A1 6/2019 Kageyama et al.

FOREIGN PATENT DOCUMENTS

JP 2009-144441 A 7/2009
JP 2010-254069 A 11/2010
JP 2014-033533 A 2/2014
JP 2020-124039 A 8/2020
JP 2020-182316 A 11/2020
WO WO 2018159463 * 9/2018

* cited by examiner

PROCESSING APPARATUS, PROCESSING SYSTEM, AND PROCESSING METHOD

CROSS-REFERENCE TO RELATED APPLICATIONS

This application is the U.S. national stage of PCT/JP2021/027701 filed on Jul. 27, 2021, which claims priority of Japanese Patent Application No. JP 2020-169222 filed on Oct. 6, 2020, the contents of which are incorporated herein.

TECHNICAL FIELD

The present disclosure relates to processing apparatus, a processing system, and a processing method.

BACKGROUND

WO2012/104957 discloses a plurality of in-vehicle processing apparatuses that execute processing. Each processing apparatus is an ECU (Electronic Control Unit). Power is supplied to the plurality of processing apparatuses from one of a main battery and a sub-battery that function as power storage devices. When the supplying of power from the main battery to the plurality of processing apparatuses has stopped, the sub-battery supplies power to the plurality of processing apparatuses.

When a predetermined condition is satisfied, as one example, when a vehicle has collided with an object, the vehicle processing to be executed by the plurality of processing apparatuses as a whole is decided in advance. The respective processing apparatuses each execute part of this vehicle processing. When the predetermined condition is satisfied and the supplying of power by the main battery has been interrupted, each of the plurality of processing apparatuses will execute part of the vehicle processing using the power supplied from the sub-battery.

When the predetermined condition is satisfied and the supplying of power by the main battery has been interrupted in a state where the degree of deterioration of the sub-battery is large, for example, there has been a significant fall in the capacity of the sub-battery, there is the possibility that the plurality of processing apparatuses will not be able to execute all of the vehicle processing. This results in the risk of the plurality of processing apparatuses not executing high-priority processing included in the vehicle processing.

SUMMARY

It is an object of the present disclosure to provide a processing apparatus, a processing system, and a processing method capable of realizing a configuration in which high-priority processing is appropriately executed when a predetermined condition is satisfied.

A processing apparatus according to one aspect of the present disclosure is mounted on a vehicle and executes processing using electrical power supplied from one of a first power storage device and a second power storage device, the processing apparatus including a processing unit for executing processing, wherein each of a plurality of processes executed by the processing unit when a predetermined condition is satisfied is decided in advance in association with a degree of deterioration of the second power storage device, and the processing unit determines, when the predetermined condition is satisfied, whether supplying of power by the first power storage device has been interrupted, and executes, when it is determined that the supplying of power by the first power storage device has been interrupted, a process corresponding to the degree of deterioration of the second power storage device, out of the plurality of processes.

A processing system according to one aspect of the present disclosure includes a first processing apparatus and a second processing apparatus that are mounted on a vehicle and execute processing using electrical power supplied from one of a first power storage device and a second power storage device, wherein the first processing apparatus and the second processing apparatus respectively include a first processing unit and a second processing unit for executing processing, the first processing unit executes processing according to an instruction from the second processing unit, each of a plurality of first processes executed by the first processing unit when a predetermined condition is satisfied is decided in advance in association with a degree of deterioration of the second power storage device, each of a plurality of second processes executed by the second processing unit when the predetermined condition is satisfied is decided in advance in association with the degree of deterioration of the second power storage device, the first processing unit determines, when the predetermined condition is satisfied, whether supplying of power by the first power storage device has been interrupted, and executes, when it has been determined that the supplying of power by the first power storage device has been interrupted, a first process corresponding to the degree of deterioration of the second power storage device out of the plurality of first processes, and the second processing unit determines, when the predetermined condition is satisfied, whether supplying of power by the first power storage device has been interrupted, and executes, when it has been determined that the supplying of power by the first power storage device has been interrupted, a second process corresponding to the degree of deterioration of the second power storage device out of the plurality of second processes.

A processing method according to one aspect of the present disclosure executes processing using electrical power supplied from one of a first power storage device and a second power storage device, wherein each of a plurality of processes executed when a predetermined condition is satisfied is decided in advance in association with a degree of deterioration of the second power storage device, and the processing method includes a computer executing: a step of determining whether supplying of power by the first power storage device has been interrupted, and a step of executing, when it has been determined that the supplying of power by the first power storage device has been interrupted, a process corresponding to a degree of deterioration of the second power storage device out of the plurality of processes.

It should be noted that the present disclosure can be realized not only as a processing apparatus with a processing unit with the characteristics described above, but also as a processing method including the characteristic processing as steps, or as a computer program for causing a computer to execute such steps. Also, the present disclosure can be implemented as a semiconductor integrated circuit that realizes part or all of the processing apparatus or as a processing system including a processing apparatus.

Effects of Disclosure

According to the present disclosure, it is possible to realize a configuration in which high-priority processing is appropriately executed when a predetermined condition is satisfied.

DETAILED DESCRIPTION OF PREFERRED EMBODIMENTS

Figure 1:
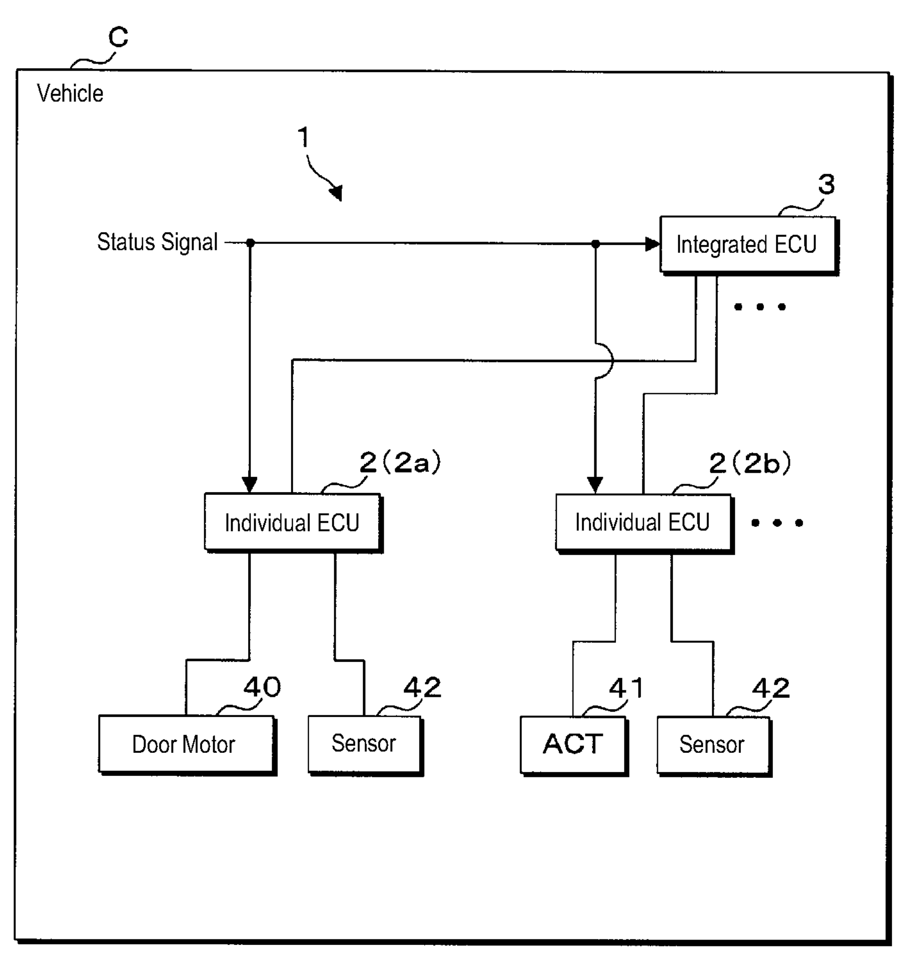
FIG. 1 is a block diagram depicting the configuration of a principal part of a processing system according to an embodiment.

Embodiments of the present disclosure will first be listed and described. At least some of the embodiments described below may be freely combined.

First Aspect

In accordance with a first aspect, a processing apparatus according to an aspect of the present disclosure is mounted on a vehicle and executes processing using electrical power supplied from one of a first power storage device and a second power storage device, the processing apparatus including a processing unit for executing processing, wherein each of a plurality of processes executed by the processing unit when a predetermined condition is satisfied is decided in advance in association with a degree of deterioration of the second power storage device, and the processing unit determines, when the predetermined condition is satisfied, whether supplying of power by the first power storage device has been interrupted, and executes, when it is determined that the supplying of power by the first power storage device has been interrupted, a process corresponding to the degree of deterioration of the second power storage device, out of the plurality of processes.

In the above aspect, the processing unit executes, when the supplying of power by the first power storage device is interrupted, a process corresponding to the degree of deterioration of the second power storage device. This means that it is possible to realize a configuration in which high-priority processing is appropriately executed when a predetermined condition is satisfied.

Second Aspect

In a second aspect, in the processing apparatus according to an aspect of the present disclosure, each of the plurality of processes is executed when the vehicle has collided with an object, and the processing unit determines whether the supplying of power by the first power storage device has been interrupted when the vehicle has collided with the object.

In the above aspect, the predetermined condition is the vehicle colliding with an object.

Third Aspect

In a third aspect, in the processing apparatus according to an aspect of the present disclosure, the deterioration of the second power storage device is a fall in capacity of the second power storage device.

In the above aspect, the deterioration of the second power storage device is a fall in capacity of the second power storage device. The capacity of the second power storage device falls due to repeated charging and discharging, for example.

Fourth Aspect

In a fourth aspect, the processing apparatus according to an aspect of the present disclosure further includes a volatile temporary storage unit and a nonvolatile storage unit, wherein in at least one process out of the plurality of processes, the processing unit writes data stored in the temporary storage unit into the storage unit.

In the above aspect, when the predetermined condition is satisfied, if the degree of deterioration in the second power storage device is small, for example, the data stored in the temporary storage unit is written into the storage unit.

Fifth Aspect

In a fifth aspect, the processing apparatus according to an aspect of the present disclosure includes a clock output unit for outputting a clock signal, wherein the processing unit executes processing in synchronization with the clock signal output by the clock output unit, and in at least one process out of the plurality of processes, the processing unit stops outputting of the clock signal.

In the above aspect, when the predetermined condition is satisfied and the supplying of power by the first power storage device is interrupted, if the degree of deterioration of the second battery is large, for example, the processing unit will stop the outputting of the clock signal. As a result, the state of the processing unit transitions to a sleep state. In this case, another apparatus to which power is being supplied from the second power storage device will execute high-priority processing.

Sixth Aspect

In a sixth aspect, in the processing apparatus according to an aspect of the present disclosure, in each of the plurality of processes, the processing unit gives an instruction for unlocking of a door of the vehicle.

In the above aspect, the high-priority processing is processing that unlocks the door of the vehicle.

Seventh Aspect

In a seventh aspect, a processing system according to an aspect of the present disclosure includes a first processing apparatus and a second processing apparatus that are mounted on a vehicle and execute processing using electrical power supplied from one of a first power storage device and a second power storage device, wherein the first processing apparatus and the second processing apparatus respectively include a first processing unit and a second processing unit for executing processing, the first processing unit executes processing according to an instruction from the second processing unit, each of a plurality of first processes executed by the first processing unit when a predetermined condition is satisfied is decided in advance in association with a degree of deterioration of the second power storage device, each of a plurality of second processes executed by the second processing unit when the predetermined condition is satisfied is decided in advance in association with the degree of deterioration of the second power storage device, the first processing unit determines, when the predetermined condition is satisfied, whether supplying of power by the first power storage device has been interrupted, and executes, when it has been determined that the supplying of power by the first power storage device has been interrupted, a first process corresponding to the degree of deterioration of the second power storage device out of the plurality of first processes, and the second processing unit determines, when the predetermined condition is satisfied, whether supplying of power by the first power storage device has been interrupted, and executes, when it has been determined that the supplying of power by the first power storage device has been interrupted, a second process corresponding to the degree of deterioration of the second power storage device out of the plurality of second processes.

In the above aspect, the second processing unit executes processing according to an instruction from the first processing unit. The first processing unit and the second processing unit respectively execute a first process and a second process corresponding to the degree of deterioration of the second power storage device when the supplying of power to the first power storage device is interrupted. This means that it is possible to realize a configuration in which high-priority processing is appropriately executed when a predetermined condition is satisfied.

Eighth Aspect

In an eighth aspect, in a processing system according to an aspect of the present disclosure, a total value of electrical power consumed by the first processing apparatus and the second processing apparatus after the supplying of power by the first power storage device has been interrupted is smaller the greater the degree of deterioration of the second power storage device.

In the above aspect, a total value of electrical power consumed by the first processing apparatus and the second processing apparatus after the supplying of power by the first power storage device has been interrupted is smaller the greater the degree of deterioration of the second power storage device.

Ninth Aspect

In a ninth aspect, a processing method according to an aspect of the present disclosure executes processing using electrical power supplied from one of a first power storage device and a second power storage device, wherein each of a plurality of processes executed when a predetermined condition is satisfied is decided in advance in association with a degree of deterioration of the second power storage device, and the processing method includes a computer executing: a step of determining whether supplying of power by the first power storage device has been interrupted, and a step of executing, when it has been determined that the supplying of power by the first power storage device has been interrupted, a process corresponding to a degree of deterioration of the second power storage device out of the plurality of processes.

In the above aspect, when supplying of power by the first power storage device is interrupted, the computer executes processing corresponding to the degree of deterioration of the second power storage device. This means that it is possible to realize a configuration in which high-priority processing is appropriately executed when a predetermined condition is satisfied.

Specific embodiments of a processing system according to the present disclosure are described below with reference to the drawings. It should be noted that the present disclosure is not limited to the examples described here, and is instead indicated by the range of the patent claims and is intended to include all modifications within the meaning and scope of the patent claims and their equivalents.

First Embodiment

Configuration of Processing System

FIG. 1 is a block diagram depicting the configuration of a principal part of a processing system 1 according to the present embodiment. The processing system 1 is mounted in a vehicle C. The processing system 1 includes a plurality of individual ECUs 2, an integrated ECU 3, a door motor 40, an actuator 41, and a plurality of sensors 42. The plurality of individual ECUs 2 include individual ECUs 2*a* and 2*b*. The number of individual ECUs 2*a* and 2*b* is not limited to one each, and may be two or more.

The door motor 40 and a sensor 42 are connected to the individual ECU 2*a*. The door motor 40 is one example of an actuator. The actuator 41 and a sensor 42 are connected to the individual ECU 2*b*. Each individual ECU 2 is connected to the integrated ECU 3.

Each sensor 42 repeatedly acquires vehicle data relating to the vehicle C. The vehicle data indicates acceleration of the vehicle C, luminance in the periphery of the vehicle C, whether it is raining, the states of switches operated by occupants of the vehicle C, images of the periphery of the vehicle C, or the like. The type of vehicle data acquired by each of the sensors 42 may be the same as or different from the type of vehicle data acquired by the other sensors 42.

Every time vehicle data is acquired, each sensor 42 outputs the acquired vehicle data to an individual ECU 2. Every time vehicle data is inputted from a sensor 42, an individual ECU 2 transmits the inputted vehicle data to the integrated ECU 3.

The door motor 40 locks and unlocks a door of the vehicle C. The integrated ECU 3 decides the operation of the door motor 40 or the actuator 41 based on one or a plurality of vehicle data received from one or a plurality of the individual ECUs 2. The integrated ECU 3 transmits instruction data indicating the decided operation to at least one of the individuals ECU 2.

When the individual ECU 2*a* has received instruction data from the integrated ECU 3, the individual ECU 2*a* outputs the received instruction data to the door motor 40. The instruction data output to the door motor 40 indicates locking or unlocking of the door. When instruction data has been inputted from the individual ECU 2*a*, the door motor 40 performs the operation indicated by the inputted instruction data. When the instruction data indicates locking, the door motor 40 locks the door. When the instruction data indicates unlocking, the door motor 40 unlocks the door.

When the individual ECU **2*b* has received instruction data from the integrated ECU 3, the individual ECU 2*b* outputs the received instruction data to the actuator 41. When instruction data has been inputted from the individual ECU 2*b*, the actuator 41** performs the operation indicated by the inputted instruction data.

Each of the individual ECU **2*a* and the integrated ECU 3 functions as a "processing apparatus". As described earlier, the individual ECU 2*a* executes processing according to the instruction data transmitted by the integrated ECU 3, that is, according to an instruction from the integrated ECU 3. Accordingly, the individual ECU 2*a* functions as a "second processing apparatus". The integrated ECU 3** functions as a "first processing apparatus".

As one example, communication between the individual ECUs 2 and the integrated ECU 3 uses Ethernet (registered trademark) communication protocol.

The integrated ECU 3 detects a collision of the vehicle C based on one or a plurality of vehicle data received from one or a plurality of the individual ECUs 2. When the integrated ECU 3 has detected a collision of the vehicle C, the integrated ECU 3 transmits collision data indicating a collision of the vehicle C to the plurality of individual ECUs 2, which includes the individual ECU **2*a***.

Supplying of Power to Individual ECUs 2 and Integrated ECU 3

Figure 2:
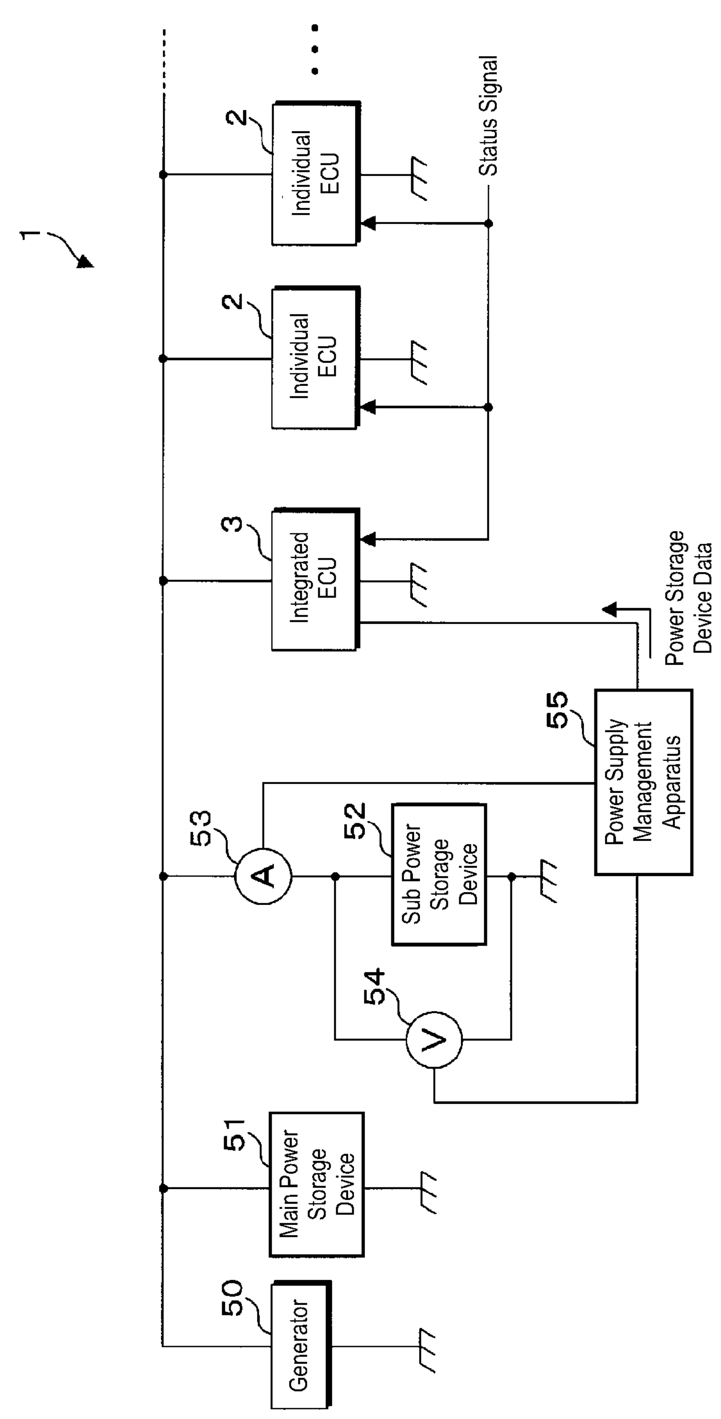
FIG. 2 is a diagram illustrating supplying of power to an integrated ECU and individual ECUs.

FIG. 2 is a diagram illustrating the supplying of power to the integrated ECU 3 and the individual ECUs 2. The processing system 1 further includes a generator 50, a main power storage device 51, a sub power storage device 52, an ammeter 53, a voltmeter 54, and a power supply management apparatus 55. The main power storage device 51 and the sub power storage device 52 are respectively lead storage batteries, lithium ion batteries, capacitors, or the like.

Each of the plurality of individual ECUs 2 and the integrated ECU 3 is connected to a positive electrode of the generator 50, a positive electrode of the main power storage device 51, and the ammeter 53. Each of the plurality of individual ECUs 2 and the integrated ECU 3 is grounded. The negative electrodes of the generator 50 and the main power storage device 51 are also grounded. The ammeter 53 is connected to the positive electrode of the sub power storage device 52 and to the power supply management apparatus 55. The negative electrode of the sub power storage device 52 is grounded. The voltmeter 54 is connected across the positive electrode and the negative electrode of the sub power storage device 52. The voltmeter 54 is further connected to the power supply management apparatus 55. The power supply management apparatus 55 is further connected to the integrated ECU 3.

The generator 50 generates AC power in conjunction with the engine of the vehicle C. The generator 50 rectifies the generated AC power to produce DC power and outputs a DC voltage for the rectified DC power from the positive electrode. When the generator 50 is generating power, a current flows from the positive electrode of the generator 50 to the individual ECUs 2, the integrated ECU 3, the main power storage device 51, and the sub power storage device 52, thereby supplying power to these components. When the generator 50 is generating power, each of the individual ECU 2 and the integrated ECU 3 executing processing that uses the power generated by the generator 50, and the main power storage device 51 and the sub power storage device 52 are charged. When the sub power storage device 52 is being charged, a current is inputted into the positive electrode of the sub power storage device 52 via the ammeter 53.

When the generator 50 has stopped generating power, one of the main power storage device 51 and the sub power storage device 52 is discharged. At this time, a current flows from the positive electrode of one of the main power storage device 51 and the sub power storage device 52 to the individual ECUs 2 and the integrated ECU 3 to supply electrical power to these components. Accordingly, when the generator 50 has stopped generating power, each of the individual ECUs 2 and the integrated ECU 3 executes processing using the electric power supplied from one of the main power storage device 51 and the sub power storage device 52. When the sub power storage device 52 is being discharged, a current is output from the positive electrode of the sub power storage device 52 via the ammeter 53.

When the output voltage of the main power storage device 51 or the sub power storage device 52 is low, the generator 50 generates electrical power. As a result, the main power storage device 51 and the sub power storage device 52 are charged, so that the output voltages of the main power storage device 51 and the sub power storage device 52 are maintained at a voltage that is equal to or higher than a certain voltage.

The electrical power consumed by each of the individual ECUs 2 and the integrated ECU 3 increases as the amount of executed processing increases.

When the sub power storage device 52 is being charged, the ammeter 53 detects the current value of the current inputted into the sub power storage device 52. When the sub power storage device 52 is being discharged, the ammeter 53 detects the current value of the current output from the sub power storage device 52. The ammeter 53 detects the current value periodically. Every time the ammeter 53 detects a current value, the ammeter 53 outputs current data indicating the detected current value to the power supply management apparatus 55. When the ammeter 53 has detected the current value of a current inputted into the sub power storage device 52, that is, the current value of the charging current, the current data exhibits a positive current value, for example. When the ammeter 53 has detected the current value of a current output from the sub power storage device 52, that is, the current value of a discharging current, the current data exhibits a negative current value, for example.

The voltmeter 54 periodically detects a voltage value across both ends of the sub power storage device 52. Every time the voltmeter 54 detects a voltage value, the voltmeter 54 outputs voltage data indicating the detected voltage value to the power supply management apparatus 55. The ammeter 53 and the voltmeter 54 perform detection at substantially the same time.

The power supply management apparatus 55 stores the current value indicated by the current data inputted from the ammeter 53 and the voltage value indicated by the voltage data inputted from the voltmeter 54. The power supply management apparatus 55 stores the current value and the voltage value indicated by the current data and the voltage data inputted at substantially the same time in association with each other. When the number of combinations of a current value and a voltage value stored in the power supply management apparatus 55 reaches a predetermined number, the power supply management apparatus 55 outputs power storage device data, which indicates all the current values and voltage values corresponding to the predetermined number of combinations, to the integrated ECU 3.

When the power storage device data has been inputted from the power supply management apparatus 55, the integrated ECU 3 estimates a degree of deterioration of the sub power storage device 52 based on the plurality of current values and the plurality of voltage values indicated by the inputted power storage device data. Deterioration of the sub power storage device 52 is a fall in the capacity of the sub power storage device 52. When the sub power storage device 52 is a capacitor, the capacity of the sub power storage device 52 is a capacitance. When the sub power storage device 52 is a battery, the capacity of the sub power storage device 52 is the amount of electric power when the sub power storage device 52 has been fully charged. The capacity of the sub power storage device 52 will fall due to repeated charging and discharging, for example.

When the sub power storage device 52 is a battery, SOH (State Of Health) can be given as an example index of the degree of deterioration. The amount of electrical power stored in the sub power storage device 52 when the sub power storage device 52 has been fully charged is referred to as the "full charge capacity". The full charge capacity of the sub power storage device 52 is divided by the full charge capacity at the time when the sub power storage device 52 was manufactured. This divided value is multiplied by 100. By doing so, the SOH is calculated. The SOH is expressed in percentage units. As one example, the SOH is estimated based on changes in the amount of electric power stored in the sub power storage device 52.

Figure 3:
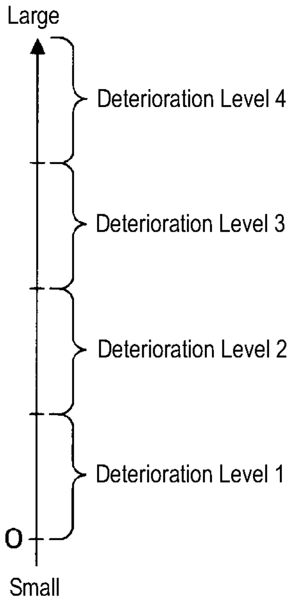
FIG. 3 is a diagram illustrating a relationship between a degree of deterioration and a deterioration level.

The integrated ECU 3 decides a deterioration level of the sub power storage device 52 based on the estimated degree of deterioration. FIG. 3 is a diagram illustrating the relationship between the degree of deterioration and the deterioration level. The numbers 1 to 4 are set as the deterioration level of the sub power storage device 52. A range in the degree of deterioration is set for each deterioration level. As depicted in FIG. 3, values within the range of the degree of deterioration corresponding to the deterioration level 1 are the smallest. As the deterioration level increases, so do the values within the range of the degree of deterioration corresponding to that deterioration level. The integrated ECU 3 decides the deterioration level of the sub power storage device 52 at a value to which the estimated degree of deterioration belongs. The integrated ECU 3 transmits deterioration data indicating the deterioration level of the sub power storage device 52 to each individual ECU 2.

As depicted in FIGS. 1 and 2, a status signal indicating the state of the main power storage device 51 is inputted into each of the individual ECUs 2 and the integrated ECU 3. The status signal indicates whether the supplying of power by the main power storage device 51 has been interrupted. Interruption of the supplying of power by the main power storage device 51 means, for example, that a connection of the main power storage device 51 is disconnected. Each of the positive electrode and the negative electrode of the main power storage device 51 is connected to a terminal, not illustrated. When at least one of the positive electrode and the negative electrode of the main power storage device 51 has become disconnected from a terminal, the connection of the main power storage device 51 is disconnected. Determination of whether the supplying of power by the main power storage device 51 has been interrupted is based, for example, on a current flowing through one of the two terminals (not illustrated) to which the positive electrode and the negative electrode of the main power storage device 51 are connected. As one example, when the current flowing through one of the two terminals is zero A, it is possible to determine that the supplying of power by the main power storage device 51 has been interrupted.

Overview of Operation of Individual ECUs 2*a* and Integrated ECU 3

Figure 4:
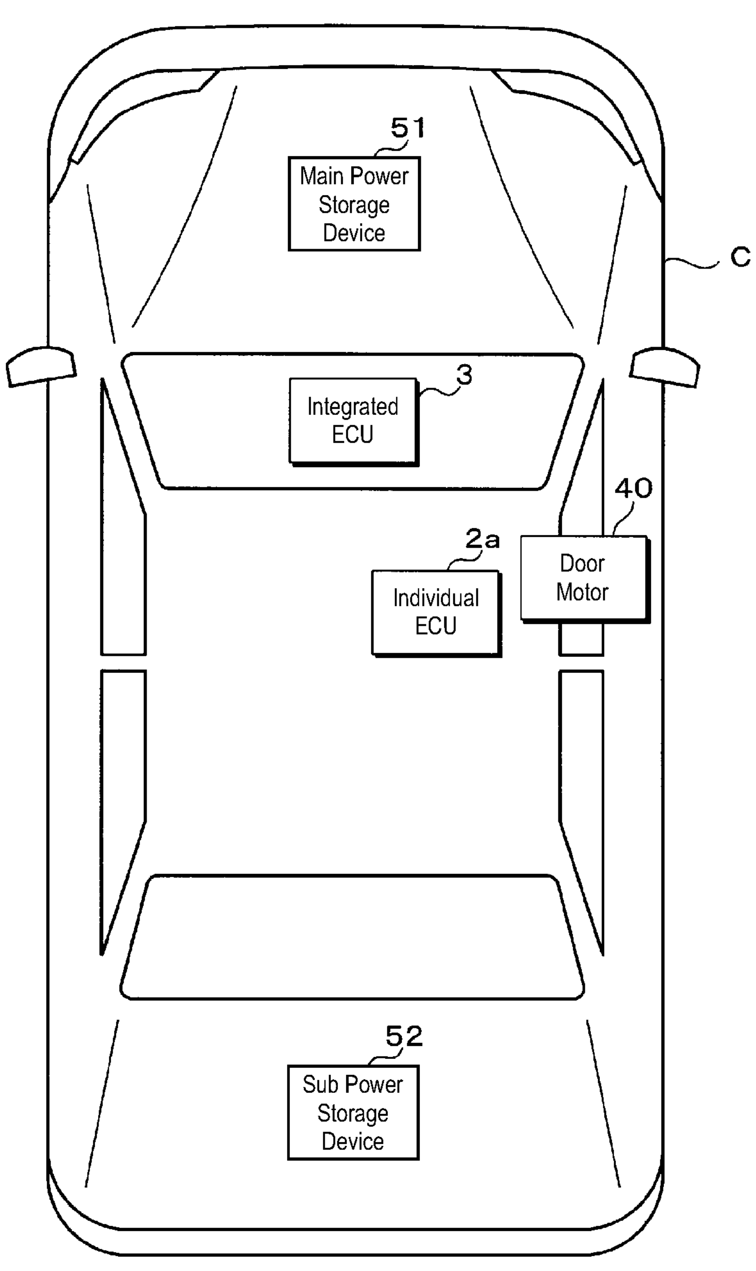
FIG. 4 is a diagram illustrating the layout of components in a vehicle.

FIG. 4 is a diagram illustrating the layout of components in the vehicle C. As depicted in FIG. 4, the main power storage device 51 is disposed at the front of the vehicle C. The sub power storage device 52 is disposed at the rear of the vehicle C. The integrated ECU 3 and the individual ECU 2*a* are disposed in the center of the vehicle C. The door motor 40 is disposed in the vicinity of the door which is locked and unlocked by the door motor 40. When the vehicle C collides with an object when the vehicle C is traveling, the supplying of power to the main power storage device 51 may be interrupted.

When the individual ECUs 2 have received the collision data from the integrated ECU 3, each individual ECU 2 executes one out of a plurality of first emergency processes. Each of the plurality of first emergency processes includes a process of instructing the door motor 40 to unlock the door. The integrated ECU 3 detects a collision of the vehicle C based on one or a plurality of the vehicle data inputted from one or a plurality of the individual ECUs 2. When the integrated ECU 3 has detected a collision of the vehicle C, the integrated ECU 3 transmits collision data to each individual ECU 2 and executes one out of a plurality of second emergency processes.

As described above, each of the plurality of first emergency processes and the plurality of second emergency processes is a process to be executed when the vehicle C has collided with an object. The vehicle C colliding with an object corresponds to the "predetermined condition".

When the integrated ECU 3 has detected a collision of the vehicle C and the supplying of power of the power storage device 51 has been interrupted, the integrated ECU 3 executes a second emergency process corresponding to the degree of deterioration of the sub power storage device 52 out of the plurality of second emergency processes. In the similar case, when the supplying of power of the main power storage device 51 has been interrupted, each individual ECU 2 executes the first emergency process corresponding to the degree of deterioration of the sub power storage device 52 out of the plurality of first emergency processes. The capacity of the sub power storage device 52 is significantly smaller than the capacity of the main power storage device 51. Even when slight deterioration has occurred in the sub power storage device 52, the amount of processing that can be executed using electrical power stored in the sub power storage device 52 is extremely limited. For this reason, a first emergency process and a second emergency process in keeping with the degree of deterioration are executed.

Configuration of Individual ECU 2*a*

Figure 5:
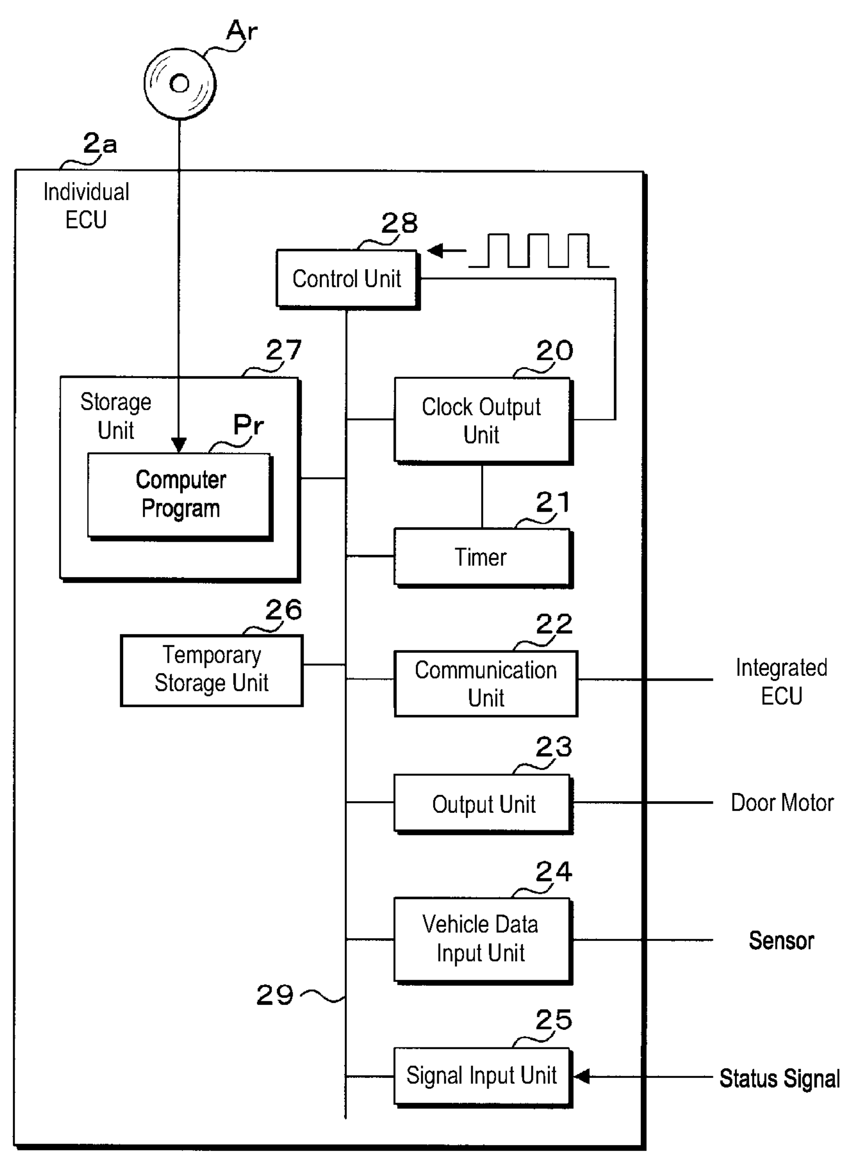
FIG. 5 is a block diagram depicting the configuration of a principal part of an individual ECU.

FIG. 5 is a block diagram depicting the configuration of a principal part of the individual ECU 2*a*. The individual ECU 2*a* includes a clock output unit 20, a timer 21, a communication unit 22, an output unit 23, a vehicle data input unit 24, a signal input unit 25, a temporary storage unit 26, a storage unit 27, and a control unit 28. These components are connected to an internal bus 29. The clock output unit 20 is separately connected to the timer 21 and the control unit 28 in addition to the internal bus 29. The communication unit 22 is further connected to the integrated ECU 3. The output unit 23 is further connected to the door motor 40. The vehicle data input unit 24 is further connected to a sensor 42.

The clock output unit 20 outputs a clock signal to the control unit 28. The clock signal indicates a low level voltage or a high level voltage. The voltage indicated by the clock signal periodically switches from the low level voltage to the high level voltage.

The control unit 28 has a processing element that executes processing, for example, a CPU (Central Processing Unit). The processing element of the control unit 28 executes processing every time the voltage indicated by the clock signal is switched from the low level voltage to the high level voltage. In this way, the control unit 28 executes processing in synchronization with the clock signal output by the clock output unit 20. The control unit 28 functions as a "processing unit" and a "first processing unit".

Note that the clock signal is not limited to a signal whose voltage is periodically switched from the low level voltage to the high level voltage, and may be a signal whose voltage is periodically switched from the high level voltage to the low level voltage. In this case, the processing element of the control unit 28 executes processing every time the voltage indicated by the clock signal is switched from the high level voltage to the low level voltage.

The clock output unit 20 stops outputting the clock signal according to an instruction from the control unit 28. When the outputting of the clock signal is stopped, the processing element of the control unit 28 stops executing processing. By doing so, the state of the control unit 28 shifts from an operating state where processing is executed to a sleep state where execution of processing is stopped. An output instruction for the clock signal from the timer 21 is inputted into the clock output unit 20. When an output instruction has been inputted, the clock output unit 20 restarts the outputting of the clock signal. By doing so, the control unit 28 restarts the execution of processing, and the state of the control unit 28 returns from the sleep state to the operating state.

The control unit 28 instructs the timer 21 to start timekeeping. On being instructed to start timekeeping, the timer 21 starts timekeeping. The elapsed time measured by the timer 21 is read out by the control unit 28. The control unit 28 instructs the timer 21 to end the timekeeping. On being instructed to end the timekeeping, the timer 21 ends the timekeeping. The control unit 28 instructs the timer 21 to start after a predetermined time has elapsed. When a start instruction has been given and a predetermined time has elapsed from the start instruction, the timer 21 will output an output instruction for the clock signal to the clock output unit 20. This predetermined time is a constant value and is set in advance.

The communication unit 22 transmits vehicle data to the integrated ECU 3 according to an instruction from the control unit 28. The communication unit 22 receives instruction data, collision data, and deterioration data from the integrated ECU 3.

The output unit 23 outputs instruction data indicating unlocking or locking of the door to the door motor 40 according to an instruction from the control unit 28.

Vehicle data is repeatedly inputted from the sensor 42 into the vehicle data input unit 24. The control unit 28 acquires the vehicle data from the vehicle data input unit 24.

A status signal is inputted into the signal input unit 25.

The temporary storage unit 26 is a volatile memory. The control unit 28 writes vehicle data and the like into the temporary storage unit 26. The data stored in the temporary storage unit 26 is read out by the control unit 28. When the supplying of power to the individual ECU 2*a* has stopped, the data stored in the temporary storage unit 26 is erased.

The storage unit 27 is a non-volatile memory. The data stored in the storage unit 27 is retained regardless of whether power is being supplied to the individual ECU 2*a*. The storage unit 27 stores the deterioration level of the sub power storage device 52. The deterioration level stored in the storage unit 27 is changed by the control unit 28. The computer program Pr is also stored in the storage unit 27. The processing element of the control unit 28 executes the operation control process, the vehicle data transmission process, a first updating process, a first selection process, the plurality of first emergency processes, and the like by executing the computer program Pr. Each of the plurality of first emergency processes is decided in advance in association with a deterioration level of the sub power storage device 52, that is, the degree of deterioration. Since the number of deterioration levels is four, the number of first emergency processes is also four.

The operation control process is a process for controlling the operation of the door motor 40, that is, an actuator. The vehicle data transmission process is a process for transmitting vehicle data. The first updating process is a process for updating the deterioration level stored in the storage unit 27. The first selection process is a process for selecting one first emergency process to be executed out of the four first emergency processes corresponding to the deterioration levels 1 to 4. As described earlier, the first emergency processes are processes to be executed when a collision of the vehicle C has been detected.

Note that the computer program Pr may be stored in a non-temporary storage medium Ar to enable the processing element of the control unit 28 to read the computer program Pr. In this case, the computer program Pr read out from the storage medium Ar by a reader apparatus, not illustrated, is written into the storage unit 27. The storage medium Ar is an optical disc, a flexible disk, a magnetic disk, a magneto-optical disc, a semiconductor memory, or the like. Optical discs include CD (Compact Disc)-ROM (Read Only Memory), DVD (Digital Versatile Disc)-ROM, and BD (Blu-ray (registered trademark) Disc). Examples of magnetic disks include a hard disk. The computer program Pr may also be downloaded from an external apparatus, not illustrated, connected to a communication network, not illustrated, and the downloaded computer program Pr may be written into the storage unit 27.

Also, the number of processing elements included in the control unit 28 is not limited to one, and may be two or more. When the control unit 28 includes a plurality of processing elements, the plurality of processing elements cooperate to execute the operation control process, the vehicle data transmission process, the first updating process, the first selection process, the four first emergency processes corresponding to the deterioration levels 1 to 4, and the like.

Operation Control Process

In the operation control process, the control unit 28 stands by until the communication unit 22 receives instruction data from the integrated ECU 3. When the communication unit 22 has received the instruction data, the control unit 28 instructs the output unit 23 to output the instruction data to the door motor 40. As described earlier, when the instruction data indicates locking, the door motor 40 locks the door of the vehicle C. When the instruction data indicates unlocking, the door motor 40 unlocks the door of the vehicle C. After this, the control unit 28 again waits until the communication unit 22 receives instruction data. When a collision of the vehicle C has been detected, the control unit 28 stops executing the operation control process.

The vehicle data transmission process, the first updating process, the first selection process, and the four first emergency processes corresponding to the deterioration levels 1 to 4 will now be described together with various processing of the integrated ECU 3.

Configuration of Integrated ECU 3

Figure 6:
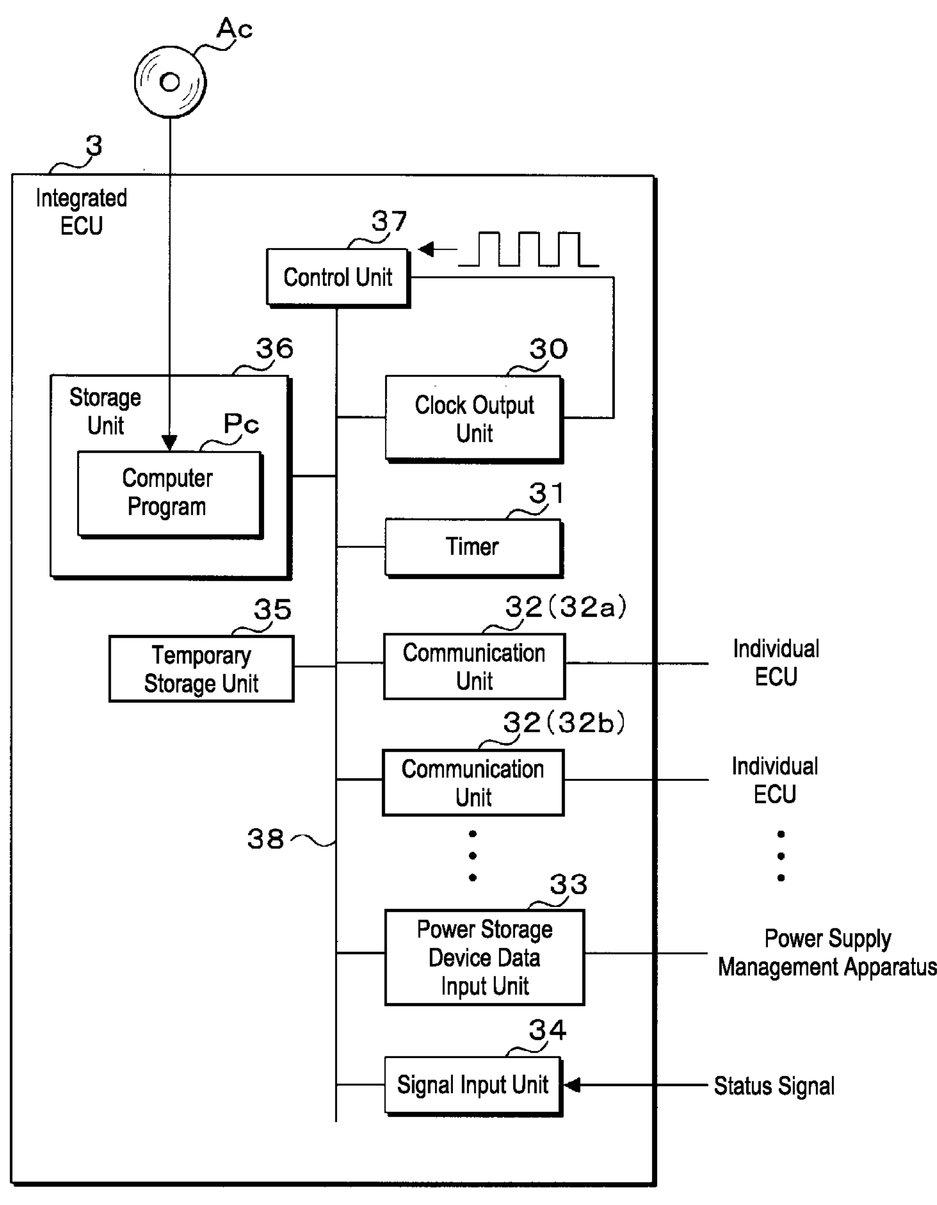
FIG. 6 is a block diagram depicting the configuration of a principal part of the integrated ECU.

FIG. 6 is a block diagram depicting the configuration of a principal part of the integrated ECU 3. The integrated ECU 3 includes a clock output unit 30, a timer 31, a plurality of communication units 32, a power storage device data input unit 33, a signal input unit 34, a temporary storage unit 35, a storage unit 36, and a control unit 37. These components are connected to the internal bus 38. Each of the plurality of communication units 32 is also connected to an individual ECU 2. The plurality of communication units 32 include a communication unit 32*a* connected to the individual ECU 2*a* and a communication unit 32*b* connected to the individual ECU 2*b*. The power storage device data input unit 33 is also connected to the power supply management apparatus 55.

The clock output unit 30 outputs a clock signal to the control unit 37. As described earlier, the voltage of the clock signal is periodically switched from the low level voltage to the high level voltage or from the high level voltage to the low level voltage.

The control unit 37 includes a processing element that executes processing, for example, a CPU. The processing element of the control unit 37 executes processing every time the voltage is switched from the low level voltage to the high level voltage or the voltage is switched from the high level voltage to the low level voltage. In this way, the control unit 37 executes processing in synchronization with the clock signal output by the clock output unit 30. The control unit 37 functions as the "processing unit" and the "second processing unit".

The clock output unit 30 stops the outputting of the clock signal according to an instruction from the control unit 37. When the outputting of the clock signal has stopped, the processing element of the control unit 37 stops executing processing. By doing so, the state of the control unit 37 shifts from an operating state to a sleep state. After the outputting of the clock signal has stopped, the clock output unit 30 restarts the outputting of the clock signal when a start condition set in advance is satisfied.

The control unit 37 instructs the timer 31 to start timekeeping. On being instructed to start timekeeping, the timer 31 starts timekeeping. The elapsed time measured by the timer 31 is read out by the control unit 37. The control unit 37 instructs the timer 31 to end the timekeeping. On being instructed to end the timekeeping, the timer 31 ends the timekeeping.

Each communication unit 32 receives vehicle data from an individual ECU 2. Each communication unit 32 transmits instruction data, collision data, and deterioration data in accordance with instructions from the control unit 37. The instruction data transmitted by the communication unit 32*a* indicates locking or unlocking of the door. The instruction data transmitted by the communication unit 32*b* indicates an operation of the actuator 41.

Power storage device data is inputted from the power supply management apparatus 55 into the power storage device data input unit 33. A status signal indicating whether the supplying of power by the main power storage device 51 has been interrupted is inputted into the signal input unit 34.

The temporary storage unit 35 is a volatile memory. The control unit 37 writes vehicle data and the like into the temporary storage unit 35. The data stored in the temporary storage unit 35 is read out by the control unit 37. When the supplying of power to the integrated ECU 3 has stopped, the data stored in the temporary storage unit 35 is erased.

The storage unit 36 is a non-volatile memory. The data stored in the storage unit 36 is retained regardless of whether power is being supplied to the integrated ECU 3. The storage unit 36 stores the deterioration level of the sub power storage device 52. The deterioration level stored in the storage unit 36 is changed by the control unit 37. The computer program Pc is also stored in the storage unit 36. The processing element of the control unit 37 executes the instruction data transmission process, a writing process, a second updating process, a second selection process, a plurality of second emergency processes, and the like by executing the computer program Pc. Each of the plurality of second emergency processes is decided in advance in association with a deterioration level of the sub power storage device 52, that is, the degree of deterioration. Since the number of deterioration levels is four, the number of second emergency treatments is four.

The instruction data transmission process is a process for transmitting instruction data to individual ECUs 2. The writing process is a process for writing vehicle data into the temporary storage unit 35 or the storage unit 36. The second updating process is a process for updating the deterioration level stored in the storage unit 36. The second selection process is a process for selecting one second emergency process to be executed from the four second emergency processes corresponding to the deterioration levels 1 to 4. As described earlier, the second emergency processes are processes to be executed when a collision of the vehicle C has been detected.

Note that the computer program Pc may be stored in a non-temporary storage medium Ac to enable the processing element of the control unit 37 to read the computer program Pc. In this case, the computer program Pc read out from the storage medium Ac by a reader apparatus, not illustrated, is written into the storage unit 36. The storage medium Ac is an optical disc, a flexible disk, a magnetic disk, a magneto-optical disc, a semiconductor memory, or the like. The computer program Pc may be downloaded from an external apparatus, not illustrated, connected to a communication network, not illustrated, and the downloaded computer program Pc may be written into the storage unit 36.

The number of processing elements included in the control unit 37 is not limited to one, and may be two or more. When the control unit 37 includes a plurality of processing elements, the plurality of processing elements cooperate to execute the instruction data transmission process, the writing process, the second updating process, the second selection process, the four second emergency processes corresponding to the four deterioration levels 1 to 4, and the like.

Instruction Data Transmission Process

In the instruction data transmission process, the control unit 37 decides the operation of the door motor 40 or the actuator 41 based on the vehicle data received by the communication units 32. The control unit 37 instructs the communication units 32 to transmit instruction data indicating the decided operation to the individuals ECU 2. Instruction data which indicates the locking or unlocking of the door is transmitted by the communication unit 32*a* to the communication unit 22 of the individual ECU 2*a*.

As described earlier, in the operation control process, when the communication unit 22 has received instruction data from the communication unit 32*a* of the integrated ECU 3, the control unit 28 of the individual ECU 2*a* instructs the output unit 23 to output the instruction data received by the communication unit 22 to the door motor 40. The operation indicated by the instruction data is decided by the control unit 28 of the integrated ECU 3. Accordingly, the control unit 28 of the individual ECU 2*a* executes processing according to the instruction of the control unit 37 of the integrated ECU 3.

Transmission and Writing of Vehicle Data

Figure 7:
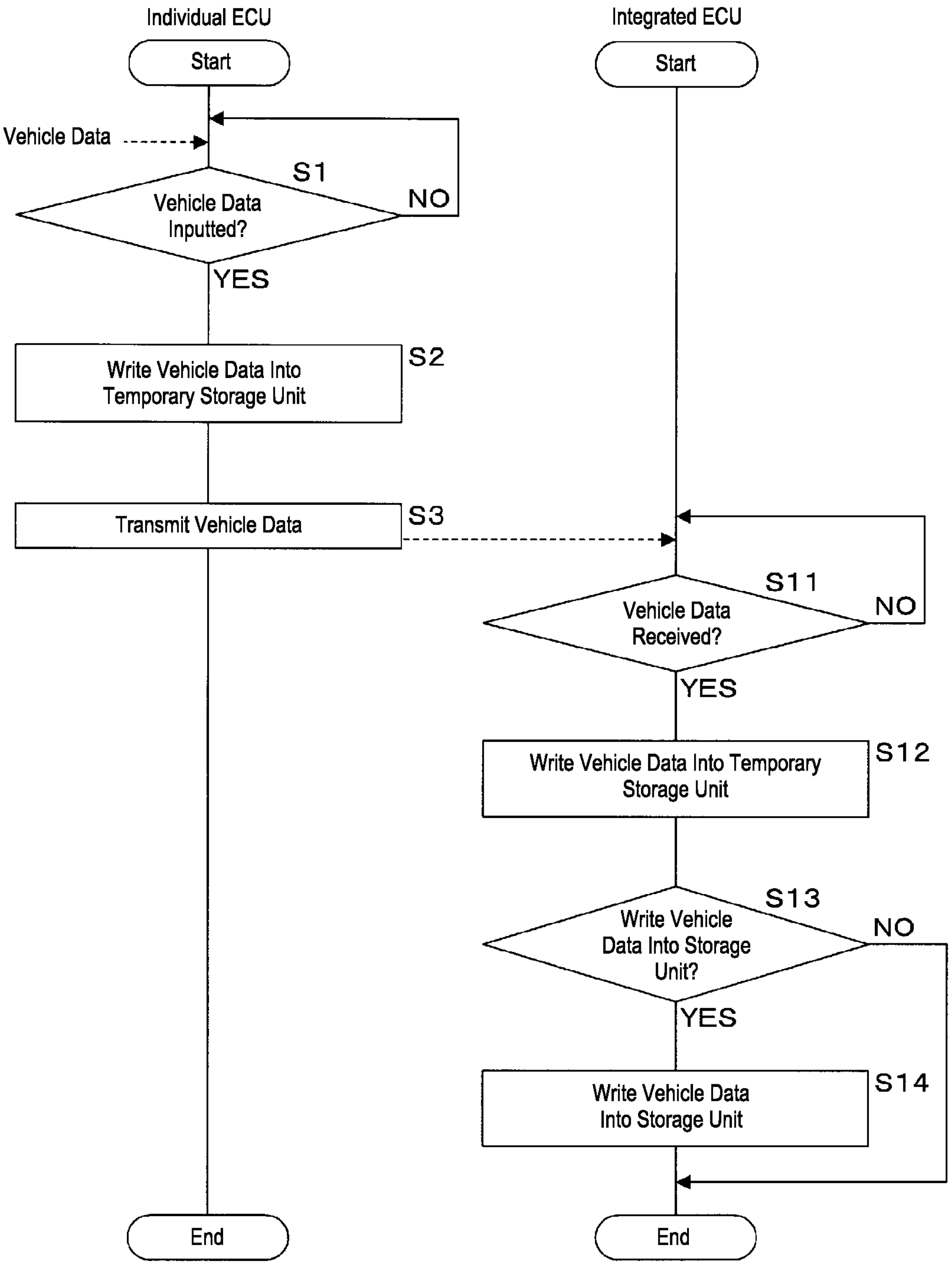
FIG. 7 is a flowchart depicting a procedure for transmitting and writing vehicle data.

FIG. 7 is a flowchart depicting a procedure for transmitting and writing vehicle data. The control unit 28 of the individual ECU 2*a* executes the vehicle data transmission process. The control unit 37 of the integrated ECU 3 executes the writing process.

In the vehicle data transmission process, the control unit 28 of the individual ECU 2*a* determines whether vehicle data has been inputted from the sensor 42 into the vehicle data input unit 24 (step S1). When the control unit 28 has determined that the vehicle data has not been inputted (S1: NO), the control unit 28 executes step S1 again and waits until the vehicle data is inputted into the vehicle data input unit 24. When the control unit 28 has determined that the vehicle data has been inputted (S1: YES), the control unit 28 writes the vehicle data that was inputted into the vehicle data input unit 24 into the temporary storage unit 26 (step S2).

After executing step S2, the control unit 28 instructs the communication unit 22 to transmit the vehicle data inputted into the vehicle data input unit 24 to the communication unit 32*a* of the integrated ECU 3 (step S3). After executing step S3, the control unit 28 ends the vehicle data transmission process. After the vehicle data transmission process has ended, the control unit 28 executes the vehicle data transmission process again and waits until vehicle data is inputted into the vehicle data input unit 24.

In the same way as the individual ECU 2*a*, when the vehicle data is inputted from the sensor 42, the individual ECU 2*b* writes the inputted vehicle data into a temporary storage unit, not illustrated, and transmits the inputted vehicle data to the communication unit 32*b* of the integrated ECU 3.

In the writing process, the control unit 37 of the integrated ECU 3 determines whether any of the plurality of communication units 32 has received vehicle data from an individual ECU 2 (step S11). When the control unit 37 has determined that none of the plurality of communication units 32 has received any vehicle data (S11: NO), the control unit 37 executes step S11 again, and waits until one of the plurality of communication units 32 receives vehicle data.

When the control unit 37 has determined that one of the plurality of communication units 32 has received vehicle data from an individual ECU 2 (S11: YES), the control unit 37 writes the vehicle data received by the communication unit 32 into the temporary storage unit 35 (step S12). Next, the control unit 37 determines whether to write the vehicle data received by the communication unit 32 into the storage unit 36 (step S13). When the control unit 37 has determined that the vehicle data is to be written (S13: YES), the control unit 37 writes the vehicle data received by the communication unit 32 into the storage unit 36 (step S14).

On determining that the vehicle data is not to be written (S13: NO) or after the step S14 has been executed, the control unit 37 ends the writing process. After the writing process ends, the control unit 37 executes the writing process again and waits until one of the plurality of communication units 32 receives vehicle data.

As described earlier, each sensor 42 repeatedly outputs vehicle data to an individual ECU 2. This means that each individual ECU 2 repeatedly transmits vehicle data to the integrated ECU 3. Regarding step S13, the control unit 37 of the integrated ECU 3 writes the vehicle data output by one sensor 42 into the storage unit 36 at intervals of a predetermined number of vehicle data. The predetermined number is an integer of two or more. When the predetermined number is two, the control unit 37 of the integrated ECU 3 writes the vehicle data into the storage unit 36 and then does not write the next two vehicle data which have been consecutively received by the communication unit 32 into the storage unit 36.

Updating of Deterioration Level

Figure 8:
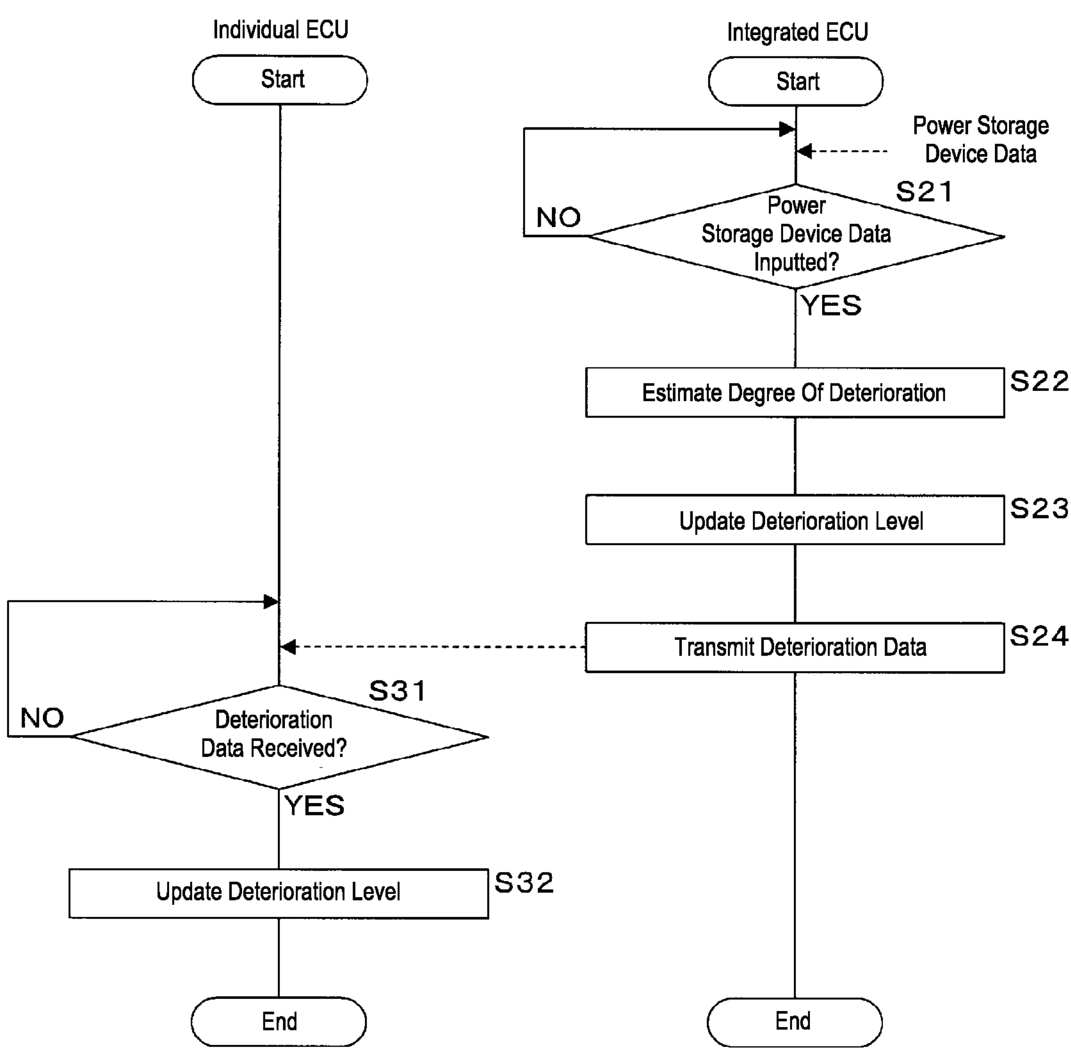
FIG. 8 is a flowchart depicting a procedure for updating a deterioration level.

FIG. 8 is a flowchart depicting the procedure for updating the deterioration level. The control unit 28 of the individual ECU 2*a* executes the first updating process. The control unit 37 of the integrated ECU 3 executes the second updating process.

In the second updating process, the control unit 37 of the integrated ECU 3 determines whether power storage device data has been inputted from the power supply management apparatus 55 into the power storage device data input unit 33 (step S21). When the control unit 37 has determined that power storage device data has not been inputted (S21: NO), the control unit 37 executes step S21 again and waits until power storage device data is inputted into the power storage device input unit 33.

When the control unit 37 has determined that the power storage device data has been inputted (S21: YES), the control unit 37 estimates the degree of deterioration of the sub power storage device 52 based on a plurality of current values and a plurality of voltage values indicated by the power storage device data inputted into the power storage device data input unit 33 (step S22). The control unit 37 updates the deterioration level stored in the storage unit 36 to a deterioration level corresponding to the degree of deterioration estimated in step S22 (step S23). Next, the control unit 37 instructs each communication unit 22 to transmit deterioration data indicating the deterioration level updated in step S23 to the individual ECUs 2 connected to the communication units 22 (step S24).

The control unit 37 ends the second updating process after executing step S24. After the second updating process ends, the control unit 37 executes the second updating process again and waits until power storage device data is inputted into the power storage device data input unit 33. The power supply management apparatus 55 repeatedly outputs the power storage device data to the integrated ECU 3. For this reason, the integrated ECU 3 repeatedly transmits deterioration data to each individual ECU 2.

In the first updating process, the control unit 28 of the individual ECU 2*a* determines whether the communication unit 22 has received deterioration data from the communication unit 32*a* of the integrated ECU 3 (step S31). When the control unit 28 has determined that the communication unit 22 has not received deterioration data (S31: NO), the control unit 28 executes step S31 again and waits until the communication unit 22 receives deterioration data. When the control unit 28 has determined that the communication unit 22 has received deterioration data (S31: YES), the control unit 28 updates the deterioration level stored in the storage unit 27 to the deterioration level indicated by the deterioration data received by the communication unit 22 (step S32).

The control unit 28 ends the first updating process after executing step S32. After the first updating process ends, the control unit 28 executes the first updating process again and waits until the communication unit 22 receives deterioration data.

The deterioration level is stored in the non-volatile storage unit of the individual ECU 2*b*. In the same way as the individual ECU 2*a*, the individual ECU 2*b* receives deterioration data from the communication unit 32*b* of the integrated ECU 3. When the individual ECU 2*b* has received deterioration data, the individual ECU 2*b* updates the deterioration level stored in the storage unit to the deterioration level indicated by the received deterioration data.

Accordingly, every time the power supply management apparatus 55 outputs the power storage device data, the deterioration levels stored in the respective individual ECUs 2 and the integrated ECU 3 are updated to a level corresponding to the degree of deterioration estimated by the control unit 37 of the integrated ECU 3.

Selection of Emergency Processes

Figure 9:
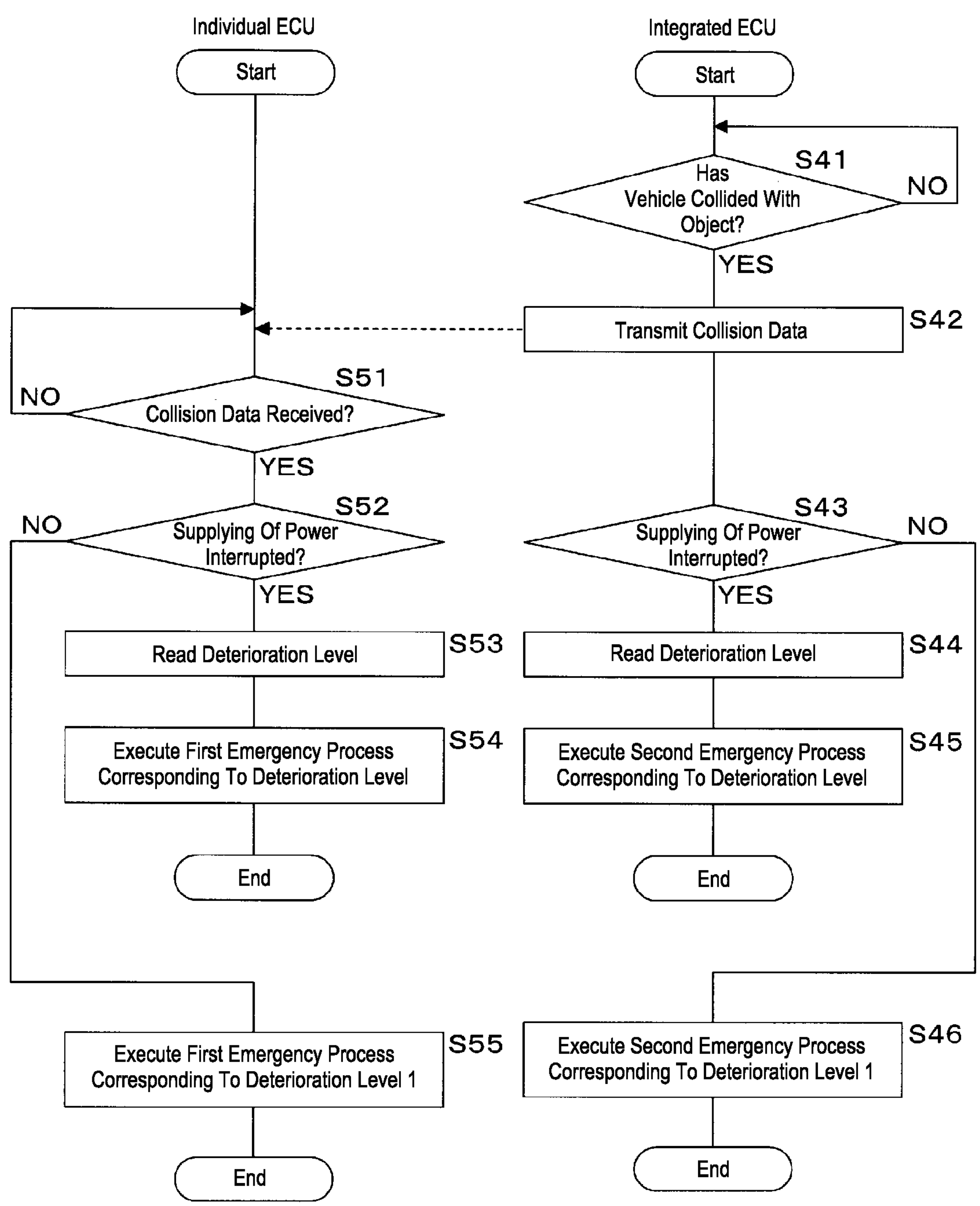
FIG. 9 is a flowchart depicting a procedure for selecting an emergency process.

FIG. 9 is a flowchart depicting the procedure for selecting emergency processes. The control unit 28 of the individual ECU 2*a* executes the first selection process. The control unit 37 of the integrated ECU 3 executes the second emergency process. As one example, the first selection process and the second selection process are executed when the ignition switch of the vehicle C is switched on.

In the second selection process, the control unit 37 of the integrated ECU 3 determines whether the vehicle C has collided with an object based, for example, on one or a plurality of vehicle data received by one or a plurality of the communication units 22 (step S41). To determine a collision, as one example, vehicle data indicating the acceleration of the vehicle C is used. When the control unit 37 has determined that the vehicle C has not collided with an object (S41: NO), the control unit 37 executes step S41 again and waits until the vehicle C collides with an object.

When the control unit 37 has determined that the vehicle C has collided with an object (S41: YES), the control unit 37 instructs the communication units 32 to transmit collision data to the individual ECUs 2 connected to those communication units 32 (step S42). After executing step S42, the control unit 37 determines whether the supplying of power by the main power storage device 51 has been interrupted based on the status signal inputted into the signal input unit 34 (step S43). When the control unit 37 has determined that the supplying of power by the main power storage device 51 has been interrupted (S43: YES), the control unit 37 reads the deterioration level from the storage unit 36 (step S44) and executes the second emergency process corresponding to the read deterioration level (step S45). After executing step S45, the control unit 37 ends the second selection process.

When the control unit 37 has determined that the supplying of power by the main power storage device 51 has not been interrupted (S43: NO), the control unit 37 executes the second emergency process corresponding to the deterioration level 1 (step S46), and ends the second selection process.

In the first selection process, the control unit 28 of the individual ECU 2*a* determines whether the communication unit 22 has received collision data from a communication unit 32*a* of the integrated ECU 3 (step S51). When the control unit 28 has determined that the communication unit 22 has not received collision data (S51: NO), the control unit 28 executes step S51 again and waits until the communication unit 22 receives collision data.

On determining that the communication unit 22 has received the collision data (S51: YES), the control unit 28 determines, based on the status signal inputted into the signal input unit 25, whether the supplying of power by the main power storage device 51 has been interrupted (step S52). When the control unit 28 has determined that the supplying of power by the main power storage device 51 has been interrupted (S52: YES), the control unit 28 reads the deterioration level from the storage unit 27 (step S53), and executes the first emergency process corresponding to the read deterioration level (step S54). After executing step S54, the control unit 28 ends the first selection process.

When the control unit 28 has determined that the supplying of power to the main power storage device 51 has not been interrupted (S52: NO), the control unit 28 executes the first emergency process corresponding to the deterioration level 1 (step S55), and ends the first selection process.

In the same way as the individual ECU 2*a*, the individual ECU 2*b* receives the collision data. When the collision data has been received, the individual ECU 2*b* determines based on the status signal whether the supplying of power by the main power storage device 51 has been interrupted. When the individual ECU 2*b* has determined that the supplying of power by the main power storage device 51 has been interrupted, the individual ECU 2*b* executes the first emergency process corresponding to the deterioration level stored in the storage unit. When the deterioration level is 1, the individual ECU 2*b* does not execute processing relating to a collision of the vehicle C. Accordingly, when it has been determined that the supplying of power by the main power storage device 51 has not been interrupted, the individual ECU 2*b* does not execute processing relating to a collision of the vehicle C.

Emergency Process for Deterioration Level 1

Figure 10:
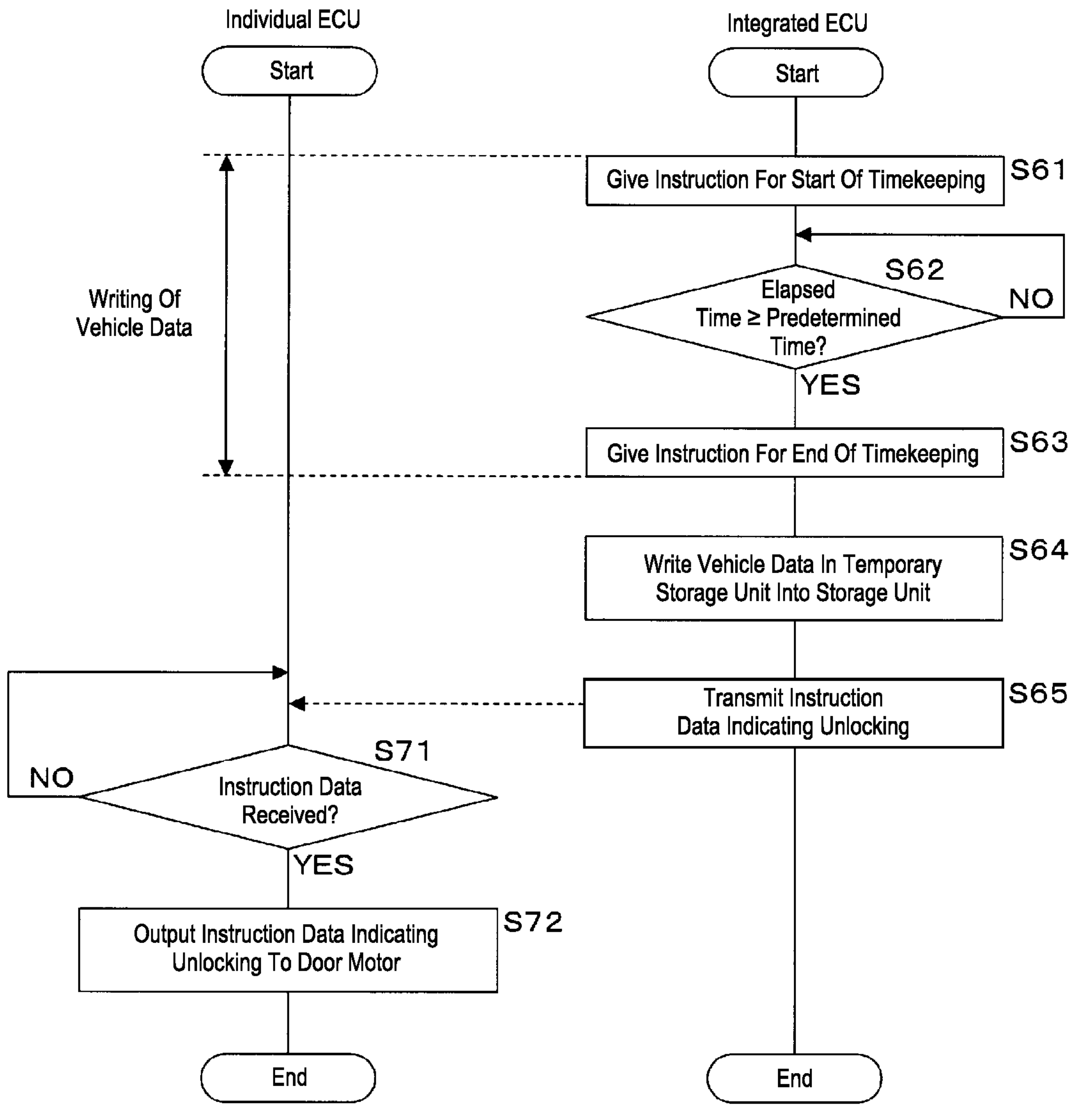
FIG. 10 is a flowchart depicting a procedure for an emergency process for deterioration level 1.

FIG. 10 is a flowchart depicting the procedure of the emergency process for deterioration level 1. As described earlier, when the deterioration level of the sub power storage device 52 is 1, or when the supplying of power by the main power storage device 51 has not been interrupted, the control unit 28 of the individual ECU 2*a* executes the first emergency process corresponding to the deterioration level 1 in steps S54 and S55 of the first selection process. In the similar case, the control unit 37 of the integrated ECU 3 executes the second emergency process corresponding to deterioration level 1 in steps S45 and S46 of the second selection process.

In the second emergency process for deterioration level 1, the control unit 37 of the integrated ECU 3 instructs the timer 31 to start timekeeping (step S61). As a result, the timer 31 starts timekeeping. Next, the control unit 37 determines whether the elapsed time measured by the timer 31 is longer than or equal to a predetermined time (step S62). When the control unit 37 has determined that the elapsed time is less than the predetermined time (S62: NO), the control unit 37 executes step S62 again and waits until the elapsed time reaches the predetermined time.

When the control unit 37 has determined that the elapsed time is longer than or equal to the predetermined time (S62: YES), the control unit 37 instructs the timer 31 to end the timekeeping (step S63). As a result, the timer 31 ends the timekeeping.

As described above, the control unit 37 waits until a predetermined time elapses after executing the second emergency process for deterioration level 1. During this period, each individual ECU 2 repeatedly transmits vehicle data and the integrated ECU 3 writes the vehicle data received from each individual ECU 2 into the temporary storage unit 35 (see FIG. 7).

After executing step S63, the control unit 37 of the integrated ECU 3 writes the plurality of vehicle data stored in the volatile temporary storage unit 35 into the non-volatile storage unit 36 (step S64). These vehicle data are used, for example, to grasp the situation when the vehicle C collided with an object. After executing step S64, the control unit 37 instructs the communication unit 32*a* to transmit instruction data indicating unlocking to the communication unit 22 of the individual ECU 2*a* (step S65). After executing step S65, the control unit 37 ends the second emergency process for deterioration level 1.

In the first emergency process for deterioration level 1, the control unit 28 of the individual ECU 2*a* determines whether the communication unit 22 has received instruction data from a communication unit 32*a* of the integrated ECU 3 (step S71). When the control unit 28 has determined that the instruction data has not been received (S71: NO), the control unit 28 executes step S71 again and waits until the communication unit 22 receives the instruction data.

The control unit 28 executes the vehicle data transmission process in parallel with the first emergency process for deterioration level 1. This means that the individual ECU 2*a* repeatedly transmits vehicle data to the integrated ECU 3 while waiting for instruction data to be received. The control unit 28 of the individual ECU 2*a* may end the vehicle data transmission process after a predetermined time has elapsed from detection of a collision of the vehicle C.

When the control unit 28 has determined that the communication unit 22 has received the instruction data (S71: YES), the control unit 28 instructs the output unit 23 to output instruction data, which indicates unlocking, to the door motor 40 (step S72). As a result, the door motor 40 unlocks the door of the vehicle C. After executing step S72, the control unit 28 ends the first emergency process for deterioration level 1. Instructing the output unit 23 to output instruction data indicating unlocking to the door motor 40 corresponds to giving an instruction to unlock the door of the vehicle C.

As described earlier, the individual ECU 2*b* does not execute processing relating to a collision of the vehicle C when the deterioration level is 1. The individual ECU 2*b* repeatedly transmits vehicle data to the integrated ECU 3. Note that the individual ECU 2*b* may end the transmission of vehicle data after a predetermined time has elapsed from the detection of a collision of the vehicle C.

Emergency Process for Deterioration Level 2

Figure 11:
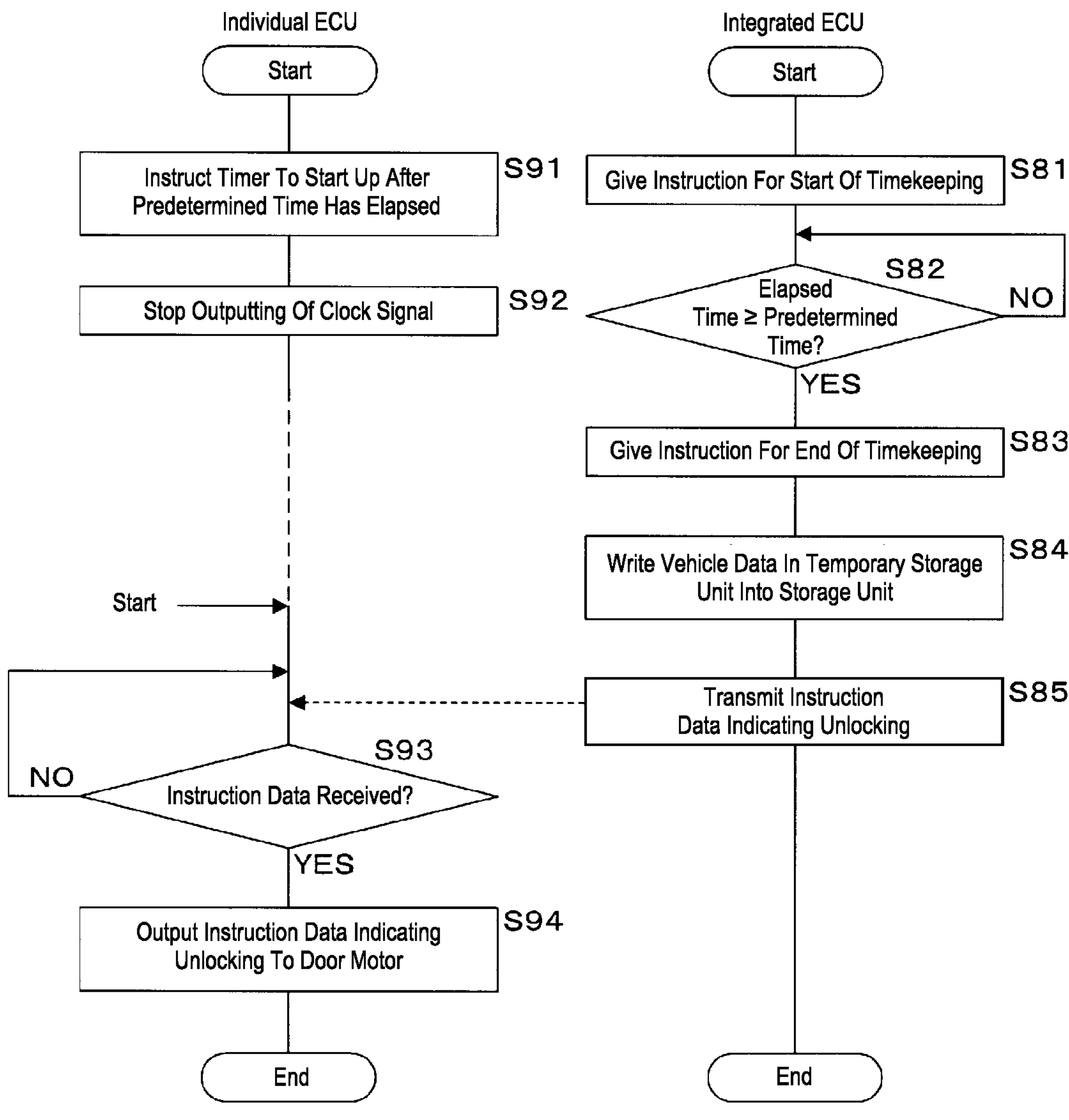
FIG. 11 is a flowchart depicting a procedure of an emergency process for deterioration level 2.

FIG. 11 is a flowchart depicting the procedure of the emergency process for deterioration level 2. As described earlier, when the deterioration level of the sub power storage device 52 is 2, the control unit 28 of the individual ECU 2*a* executes the first emergency process corresponding to deterioration level 2 in step S54 of the first selection process. In the same way, the control unit 37 of the integrated ECU 3 executes the second emergency process corresponding to deterioration level 2 in step S45 of the second selection process.

In the second emergency process for deterioration level 1, the control unit 37 of the integrated ECU 3 instructs the timer 31 to start timekeeping (step S81). As a result, the timer 31 starts timekeeping. Next, the control unit 37 determines whether the elapsed time measured by the timer 31 is longer than or equal to a predetermined time (step S82). When the control unit 37 has determined that the elapsed time is less than the predetermined time (S82: NO), the control unit 37 executes step S82 again and waits until the measured time reaches the predetermined time.

When the control unit 37 has determined that the measured time is longer than or equal to the predetermined time (S82: YES), the control unit 37 instructs the timer 31 to end the timekeeping (step S83). As a result, the timer 31 ends the timekeeping.

As described above, the control unit 37 waits until a predetermined time elapses after execution of the second emergency process for deterioration level 2. During this period, as will be described later, the status of each individual ECU 2 is the sleep state, and vehicle data is not transmitted from each individual ECU 2 to the integrated ECU 3.

After executing step S83, the control unit 37 of the integrated ECU 3 writes the plurality of vehicle data stored in the volatile temporary storage unit 35 into the non-volatile storage unit 36 (step S84). These vehicle data are used, for example, to grasp the situation when the vehicle C collided with an object. After executing step S84, the control unit 37 instructs the communication unit 32*a* to transmit instruction data indicating unlocking to the communication unit 22 of the individual ECU 2*a* (step S85). After executing step S85, the control unit 37 ends the second emergency process for deterioration level 2.

In the first emergency process for deterioration level 2, the control unit 28 of the individual ECU 2*a* instructs the timer 21 to start after a predetermined time has elapsed (step S91), and instructs the clock output unit 20 to stop outputting the clock signal (step S92). As a result, the control unit 28 stops processing, and the state of the control unit 28 transitions to the sleep state. The control unit 28 does not execute the vehicle data transmission process from the transition of the state of the control unit 28 to the sleep state until the end of the first emergency process for deterioration level 2. When the timer 21 has output an output instruction for a clock signal to the clock output unit 20, the control unit 28 starts up and the state of the control unit 28 transitions from the sleep state to the operating state.

After the control unit 28 starts up, the control unit 28 determines whether the communication unit 22 has received instruction data from the communication unit 32*a* of the integrated ECU 3 (step S93). When the control unit 28 has determined that the communication unit 22 has not received instruction data (S93: NO), the control unit 28 executes step S93 again and waits until the communication unit 22 receives the instruction data.

When the control unit 28 has determined that the communication unit 22 has received the instruction data (S93: YES), the control unit 28 instructs the output unit 23 to output instruction data indicating unlocking to the door motor 40 (step S94). As a result, the door motor 40 unlocks the door of the vehicle C. After executing step S94, the control unit 28 ends the first emergency process for deterioration level 2.

In the first emergency process for deterioration level 2, the individual ECU 2*b* stops outputting of the clock signal. As a result, a control unit, not illustrated, that executes processing stops operating and the state of the control unit transitions to the sleep state. After this, the state of the control unit of the individual ECU 2*b* is kept in the sleep state at least until the control unit 28 of the individual ECU 2*a* has completed the first emergency process for deterioration level 2.

Emergency Processing for Deterioration Level 3

Figure 12:
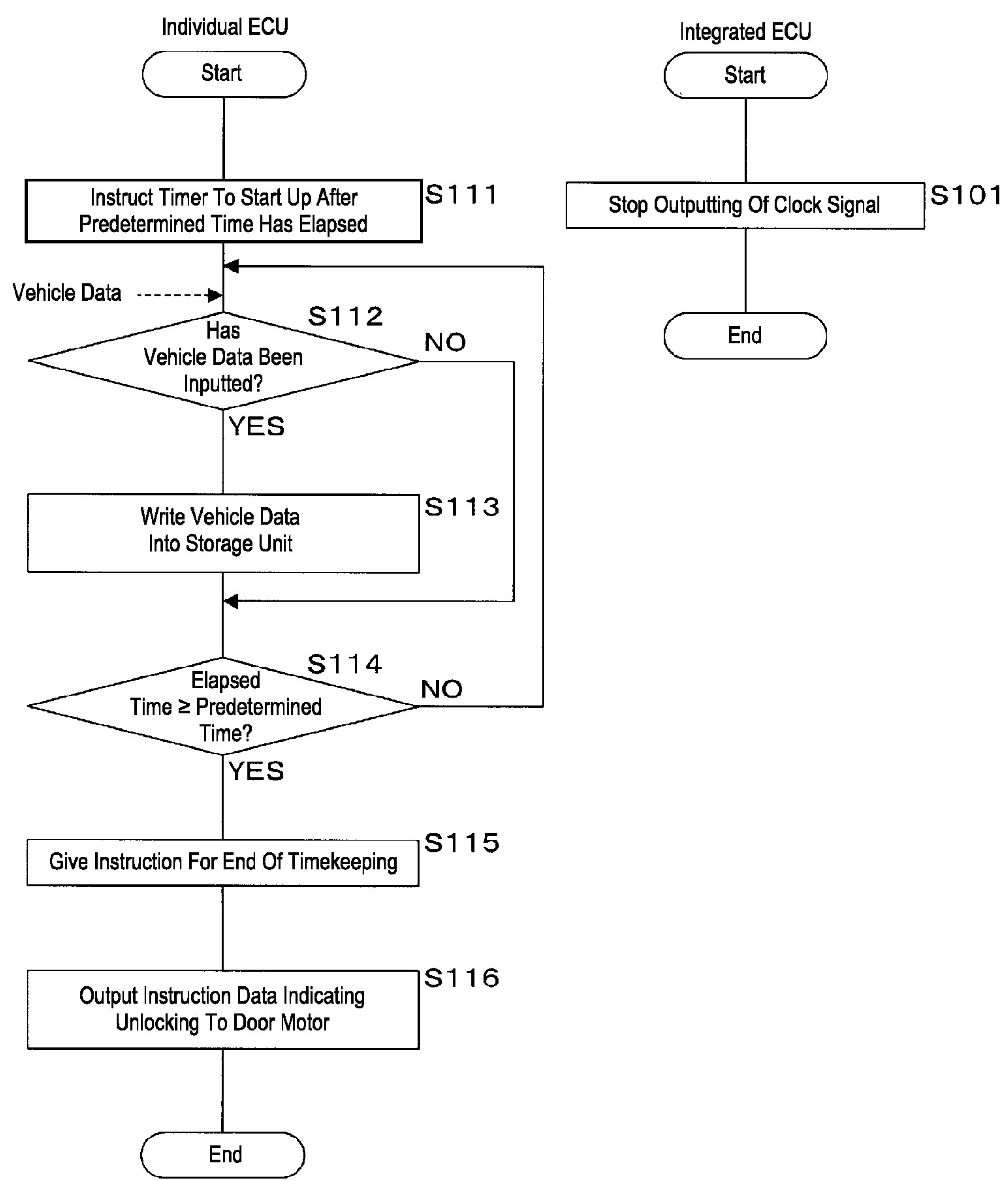
FIG. 12 is a flowchart depicting a procedure for an emergency process for deterioration level 3.

FIG. 12 is a flowchart depicting the procedure of the emergency process for deterioration level 3. As described earlier, when the deterioration level of the sub power storage device 52 is 3, the control unit 28 of the individual ECU 2*a* executes the first emergency process corresponding to deterioration level 3 in step S54 of the first selection process. In the same way, the control unit 37 of the integrated ECU 3 executes the second emergency process corresponding to deterioration level 3 in step S45 of the second selection process.

In the second emergency process for deterioration level 3, the control unit 37 of the integrated ECU 3 instructs the clock output unit 30 to stop outputting the clock signal (step S101). As a result, the control unit 37 stops processing and the state of the control unit 37 transitions to the sleep state. After that, the state of the control unit 37 is kept in the sleep state at least until the control unit 28 of the individual ECU 2*a* ends the first emergency process for deterioration level 3. After executing step S101, the control unit 37 ends the second emergency process for deterioration level 3.

The control unit 28 of the individual ECU 2*a* stops the vehicle data transmission process when the first emergency process for deterioration level 3 has been executed. In the first emergency process for deterioration level 3, the control unit 28 instructs the timer 21 to start timekeeping (step S111). As a result, the timer 21 starts timekeeping. After executing step S111, the control unit 28 determines whether vehicle data has been inputted from the sensor 42 into the vehicle data input unit 24 (step S112).

When the control unit 28 has determined that vehicle data has been inputted (S112: YES), the control unit 28 writes the vehicle data inputted into the vehicle data input unit 24 into the non-volatile storage unit 27 (step S113). When the control unit 28 has determined that the vehicle data has not been inputted (S112: NO), or after step S113 has been executed, the control unit 28 determines whether the elapsed time measured by the timer 21 is longer than or equal to a predetermined time (step S114).

When the control unit 28 has determined that the measured time is less than the predetermined time (S114: NO), the control unit 28 executes step S112 again. The vehicle data inputted from the sensor 42 is repeatedly written into the storage unit 27 until the time measured by the timer 21 reaches the predetermined time. When the control unit 28 has determined that the measured elapsed time is longer than or equal to a predetermined time (S114: YES), the control unit 28 instructs the timer 21 to end the timekeeping (step S115). As a result, the timer 21 ends the timekeeping.

After executing step S115, the control unit 28 instructs the output unit 23 to output instruction data indicating unlocking to the door motor 40 (step S116). As a result, the door motor 40 unlocks the door of the vehicle C. After executing step S116, the control unit 28 ends the first emergency process for deterioration level 3.

In the first emergency process for deterioration level 3, the individual ECU 2*b* repeatedly writes the vehicle data inputted from the sensor 42 into a non-volatile storage unit from the start of the first emergency process until a predetermined time elapses. After this, the control unit of the individual ECU 2*b* ends the first emergency process for deterioration level 3.

Emergency Process for Deterioration Level 4

Figure 13:
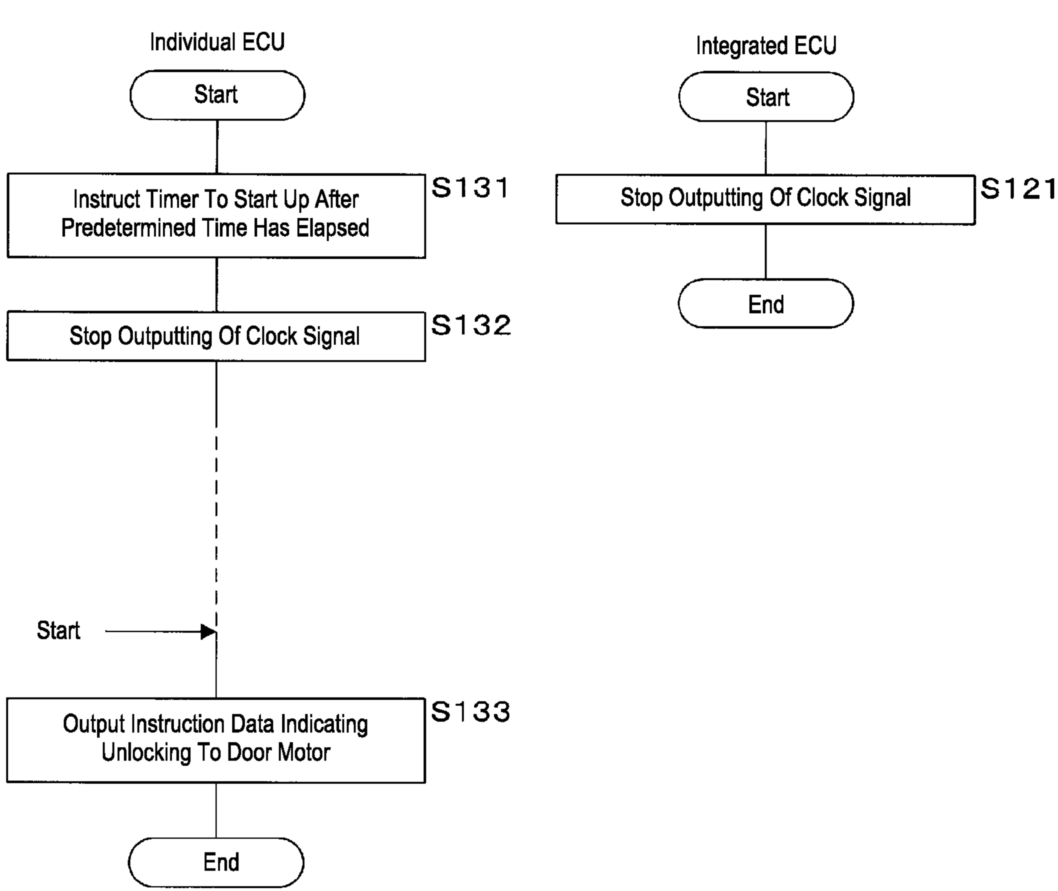
FIG. 13 is a flowchart depicting a procedure of an emergency process for deterioration level 4.

FIG. 13 is a flowchart depicting the procedure of the emergency process for deterioration level 4. As described earlier, when the deterioration level of the sub power storage device 52 is 4, the control unit 28 of the individual ECU 2*a* executes the first emergency process corresponding to deterioration level 4 in step S54 of the first selection process. In the same way, the control unit 37 of the integrated ECU 3 executes the second emergency process corresponding to deterioration level 4 in step S45 of the second selection process.

In the second emergency process for deterioration level 4, the control unit 37 of the integrated ECU 3 instructs the clock output unit 30 to stop outputting the clock signal (step S121). As a result, the control unit 37 stops processing, and the state of the control unit 37 transitions to the sleep state. After this, the state of the control unit 37 is kept in the sleep state at least until the control unit 28 of the individual ECU 2*a* completes the first emergency process for deterioration level 4. After executing step S121, the control unit 37 ends the second emergency process for deterioration level 3.

In the first emergency process for deterioration level 4, the control unit 28 of the individual ECU 2*a* instructs the timer 21 to start after a predetermined time has elapsed (step S131) and instructs the clock output unit 20 to stop outputting the clock signal (step S132). As a result, the control unit 28 stops processing and the state of the control unit 28 transitions to the sleep state. The control unit 28 does not execute the vehicle data transmission process from the state of the control unit 28 transitioning to the sleep state until the end of the first emergency process for deterioration level 4. When the timer 21 has output an output instruction for the clock signal to the clock output unit 20, the control unit 28 starts up and the state of the control unit 28 transitions from the sleep state to the operating state.

After starting up, the control unit 28 instructs the output unit 23 to output instruction data indicating unlocking to the door motor 40 (step S133). As a result, the door motor 40 unlocks the door of the vehicle C. After executing step S133, the control unit 28 ends the first emergency process for deterioration level 4.

Power Consumption of Individual ECU 2*a* and Integrated ECU 3

When the vehicle C has collided, a total amount of processing executed by the control unit 28 of the individual ECU 2*a* and the control unit 37 of the integrated ECU 3 following an interruption to the supplying of power by the main power storage device 51 will fall in keeping with the deterioration level of the sub power storage device 52. For this reason, when the vehicle C has collided, the total electrical power consumed by the individual ECU 2*a* and the integrated ECU 3 after the supplying of power by the main power storage device 51 has been interrupted will decrease as the deterioration level of the sub power storage device 52 increases, that is, as the degree of deterioration increases.

Effects of Individual ECUs 2*a* and Integrated ECU 3

When the vehicle C has collided with an object, the plurality of individual ECUs 2 and the integrated ECU 3 as a whole will unlock the door of the vehicle C and write the vehicle data. When the vehicle C has collided with an object, the door of the vehicle C is unlocked so that the occupants can escape from the vehicle C. After the vehicle C has collided with an object, as one example, vehicle data is written in order to grasp the situation at the time of the collision. The priority of the processing that unlocks the door of the vehicle C is higher than the priority of the processing that writes the vehicle data.

As described above, the control unit 28 of the individual ECU 2*a* and the control unit of the individual ECU 2*b* execute a first emergency process corresponding to the deterioration level of the sub power storage device 52. The control unit 37 of the integrated ECU 3 executes a second emergency process corresponding to the deterioration level of the sub power storage device 52. This means that it is possible to realize a configuration which appropriately executes a high priority process, that is, a process of unlocking the door of the vehicle C, when the vehicle C has collided.

Also, when the vehicle C has collided with an object and the deterioration level of the sub power storage device 52 is 2 or less, the control unit 37 of the integrated ECU 3 writes the vehicle data stored in the temporary storage unit 35 into the storage unit 36. In this case, not only the high-priority processing but also low-priority processing is executed.

Regarding the writing of vehicle data, the lower the deterioration level, the larger the number of vehicle data written into the storage unit 36.

In addition, when the vehicle C has collided with an object and the deterioration level of the sub power storage device 52 is 2, the control unit 28 of the individual ECU 2*a* stops executing processing. When the vehicle C has collided with an object and the deterioration level of the sub power storage device 52 is 3 or higher, the control unit 37 of the integrated ECU 3 stops executing processing. By doing so, unlocking of the doors is appropriately executed by the individual ECU 2*a*.

EXAMPLE MODIFICATION

In the present embodiment, the timing for determining whether the supplying of power to the sub power storage device 52 has been interrupted is not limited to the timing of a collision of the vehicle C. It is not problematic for the predetermined condition to be any phenomenon where there is the possibility of interruption to the supplying of power by the main power storage device 51. The high priority processing is not limited to processing that unlocks a door. When the vehicle C has collided with an object, the operations performed by the plurality of individual ECUs 2 and the integrated ECU 3 as a whole are not limited to unlocking the door of the vehicle C and the writing of vehicle data.

The deterioration in the sub power storage device 52 is not limited to a fall in the capacity of the sub power storage device 52, and may be an increase in an internal resistance value of the sub power storage device 52. The internal resistance value of the sub power storage device 52 is also calculated based on a plurality of current values and a plurality of voltage values indicated by the power storage device data. In at least one of the four first emergency processes corresponding to the deterioration levels 1 to 4, the control unit 28 of the individual ECU 2*a* may write the vehicle data stored in the temporary storage unit 26 into the storage unit 27.

The method by which the control unit 37 of the integrated ECU 3 detects a collision of the vehicle C is not limited to a method of detecting a collision based on one or a plurality of vehicle data. As one example, with a configuration where a collision signal is inputted from an airbag into the integrated ECU 3 when the vehicle C has collided with an object, a collision of the vehicle C may be detected based on whether a collision signal has been inputted. In the configuration in which a collision signal is inputted into each individual ECU 2, the control unit 28 of the individual ECU 2*a* may determine whether the vehicle C has collided with an object based on whether a collision signal has been inputted in step S51 in the first selection process. When the control unit 28 has determined that the vehicle C has not collided with an object, the control unit 28 waits until the vehicle C collides with an object. When the control unit 28 has determined that the vehicle C has collided with an object, the control unit 28 executes step S52. In a configuration where a collision signal is inputted into each individual ECU 2, the individual ECU 2*b* may determine whether the vehicle C has collided with an object in the same way as the individual ECU 2*a*.

The number of deterioration levels is not limited to four, and may be two, three, or five or more. The number of each of the first emergency processes and the second emergency processes matches the number of deterioration levels. The number of door motors 40 or actuators 41 connected to each individual ECU 2 is not limited to one, and may be two or more. In the same way, the number of sensors 42 connected to each individual ECU 2 is not limited to one, and may be two or more.

Each of the plurality of individual ECUs 2 and the integrated ECU 3 may be connected by a bus. In this case, as one example, CAN (Controller Area Network) communication protocol is used for each of the plurality of individual ECUs 2 and the integrated ECU 3. Each of the individual ECUs 2*a* and 2*b* may have a function of distributing electrical power to a plurality of electric devices, such as the door motor 40, the actuator 41, or the sensors 42. The processing element included in the control unit 37 of the integrated ECU 3 may be a vehicle computer.

All features of the embodiments disclosed here are exemplary and should not be regarded as limitations on the present disclosure. The scope of the present disclosure is defined not by the foregoing description, but by the claims, and all modifications that are equivalent to or within the claims are included.

The invention claimed is:

1. A processing apparatus that is mounted on a vehicle and executes processing using electrical power supplied from one of a first power storage device and a second power storage device, the processing apparatus comprising a processing unit for executing processing, wherein each of a plurality of processes executed by the processing unit when a predetermined condition is satisfied is decided in advance in association with a degree of deterioration of the second power storage device, and the processing unit determines, when the predetermined condition is satisfied, whether supplying of power by the first power storage device has been interrupted, and executes, when it is determined that the supplying of power by the first power storage device has been interrupted, a vehicle process corresponding to the degree of deterioration of the second power storage device, out of the plurality of vehicle processes, wherein the degree of deterioration corresponds to a reduction in a capacitance of the second power storage device.

2. The processing apparatus according to claim 1, wherein each of the plurality of processes is executed when the vehicle has collided with an object, and the processing unit determines whether the supplying of power by the first power storage device has been interrupted when the vehicle has collided with the object.

3. The processing apparatus according to claim 1, further comprising a volatile temporary storage unit and a nonvolatile storage unit, wherein in at least one process out of the plurality of processes, the processing unit writes data stored in the temporary storage unit into the storage unit.

4. The processing apparatus according to claim 1, further comprising a clock output unit for outputting a clock signal, wherein the processing unit executes processing in synchronization with the clock signal output by the clock output unit, and in at least one process out of the plurality of processes, the processing unit stops outputting of the clock signal.

5. The processing apparatus according to claim 1, wherein in each of the plurality of vehicle processes, the processing unit gives an instruction for unlocking of a door of the vehicle.

6. A processing system comprising a first processing apparatus and a second processing apparatus that are mounted on a vehicle and execute processing using electrical power supplied from one of a first power storage device and a second power storage device, wherein the first processing apparatus and the second processing apparatus respectively include a first processing unit and a second processing unit for executing processing, the first processing unit executes processing according to an instruction from the second processing unit, each of a plurality of first processes executed by the first processing unit when a predetermined condition is satisfied is decided in advance in association with a degree of deterioration of the second power storage device, wherein the degree of deterioration corresponds to a reduction in a capacitance of the second power storage device, each of a plurality of second processes executed by the second processing unit when the predetermined condition is satisfied is decided in advance in association with the degree of deterioration of the second power storage device, the first processing unit determines, when the predetermined condition is satisfied, whether supplying of power by the first power storage device has been interrupted, and executes, when it has been determined that the supplying of power by the first power storage device has been interrupted, a first process corresponding to the degree of deterioration of the second power storage device out of the plurality of first processes, and the second processing unit determines, when the predetermined condition is satisfied, whether supplying of power by the first power storage device has been interrupted, and executes, when it has been determined that the supplying of power by the first power storage device has been interrupted, a second process corresponding to the degree of deterioration of the second power storage device out of the plurality of second processes.

7. The processing system according to claim 6, wherein a total value of electrical power consumed by the first processing apparatus and the second processing apparatus is made smaller the greater the degree of deterioration of the second power storage device after the supplying of power by the first power storage device has been interrupted.

8. A processing method that executes processing using electrical power supplied from one of a first power storage device and a second power storage device, wherein each of a plurality of processes executed when a predetermined condition is satisfied is decided in advance in association with a degree of deterioration of the second power storage device, and the processing method comprises a computer executing:

a step of determining whether supplying of power by the first power storage device has been interrupted, and a step of executing, when it has been determined that the supplying of power by the first power storage device has been interrupted, a process corresponding to a degree of deterioration of the second power storage device out of the plurality of processes, wherein the degree of deterioration corresponds to a reduction in a capacitance of the second power storage device.

9. The processing apparatus according to any one of claim 2, further comprising a volatile temporary storage unit and a nonvolatile storage unit, wherein in at least one process out of the plurality of processes, the processing unit writes data stored in the temporary storage unit into the storage unit.

10. The processing apparatus according to any one of claim 2, further comprising a clock output unit for outputting a clock signal, wherein the processing unit executes processing in synchronization with the clock signal output by the clock output unit, and in at least one process out of the plurality of processes, the processing unit stops outputting of the clock signal.

11. The processing apparatus according to any one of claim 3, further comprising a clock output unit for outputting a clock signal, wherein the processing unit executes processing in synchronization with the clock signal output by the clock output unit, and in at least one process out of the plurality of processes, the processing unit stops outputting of the clock signal.

12. The processing apparatus according to any one of claim 2, wherein in each of the plurality of processes, the processing unit gives an instruction for unlocking of a door of the vehicle.

13. The processing apparatus according to any one of claim 3, wherein in each of the plurality of processes, the processing unit gives an instruction for unlocking of a door of the vehicle.

14. The processing apparatus according to any one of claim 4, wherein in each of the plurality of processes, the processing unit gives an instruction for unlocking of a door of the vehicle.

* * * * *